(12) United States Patent
Orlowski et al.

(10) Patent No.: US 9,792,985 B2
(45) Date of Patent: Oct. 17, 2017

(54) RESISTIVE VOLATILE/NON-VOLATILE FLOATING ELECTRODE LOGIC/MEMORY CELL

(75) Inventors: Marius Orlowski, Blacksburg, VA (US); Tong Liu, Blacksburg, VA (US); Mohini Verma, Blacksburg, VA (US); Yuhong Kang, Blacksburg, VA (US)

(73) Assignee: Virginia Tech Intellectual Properties, Inc., Blacksburg, VA (US)

( * ) Notice: Subject to any disclaimer, the term of this patent is extended or adjusted under 35 U.S.C. 154(b) by 382 days.

(21) Appl. No.: 14/233,911

(22) PCT Filed: Jul. 23, 2012

(86) PCT No.: PCT/US2012/047846
§ 371 (c)(1),
(2), (4) Date: Jun. 12, 2014

(87) PCT Pub. No.: WO2013/016283
PCT Pub. Date: Jan. 31, 2013

(65) Prior Publication Data
US 2014/0293678 A1 Oct. 2, 2014

Related U.S. Application Data

(60) Provisional application No. 61/510,736, filed on Jul. 22, 2011, provisional application No. 61/539,575, filed on Sep. 27, 2011, provisional application No. 61/671,875, filed on Jul. 16, 2012.

(51) Int. Cl.
*G11C 13/00* (2006.01)
*H01L 45/00* (2006.01)
(Continued)

(52) U.S. Cl.
CPC .......... *G11C 13/0069* (2013.01); *G11C 11/54* (2013.01); *G11C 13/0004* (2013.01);
(Continued)

(58) Field of Classification Search
CPC ... H01L 45/06; H01L 45/1233; H01L 45/085; G11C 13/0002; G11C 13/0069;
(Continued)

(56) References Cited

U.S. PATENT DOCUMENTS 8,450,709 B2 * 5/2013 Kusai ................... G11C 11/5685
257/2
9,105,838 B2 * 8/2015 Haimoto ............... H01L 45/085
(Continued)

FOREIGN PATENT DOCUMENTS

DE    WO 2010136056 A1 * 12/2010  ......... G11C 11/5685

*Primary Examiner* — Han Yang
*Assistant Examiner* — Jerome Leboeuf
(74) *Attorney, Agent, or Firm* — Whitham, Curtis & Cook, P.C.

(57) ABSTRACT

A resistive floating electrode device (RFED) provides a logic cell or non-volatile storage or dynamic or static random access memory on an extremely compact matrix with individual cells scalable to the minimum available lithographic feature size regime by providing atomic switches connected in anti-parallel relationship, preferably with a common inert electrode. Programming is facilitated by limiting current to a compliance current level in order to maintain an OB state from which the cell can be written to either the 0 or 1 state. A perfecting feature of the invention provides for selective operation of a cell as a diode or in a volatile or non-volatile storage mode within the same memory array. A series connection of three or more RFEDs in accordance with the invention having different ON state currents, OFF state currents and reset currents can be used as adaptive, neural or chaotic logic cells.

19 Claims, 17 Drawing Sheets

(51) Int. Cl.
*H01L 27/24* (2006.01)
*G11C 14/00* (2006.01)
*G11C 11/54* (2006.01)

(52) U.S. Cl.
CPC .......... *G11C 13/0011* (2013.01); *G11C 14/00* (2013.01); *H01L 27/2463* (2013.01); *H01L 45/08* (2013.01); *H01L 45/085* (2013.01); *H01L 45/1233* (2013.01); *H01L 45/1253* (2013.01); *H01L 45/1266* (2013.01); *H01L 45/146* (2013.01); *G11C 2013/0071* (2013.01)

(58) Field of Classification Search
CPC ............ G11C 13/0007; G11C 2213/15; G11C 2213/10; G11C 2213/56; G11C 2213/50
USPC .................. 365/148; 257/E45.001, E45.002, 257/E45.003
See application file for complete search history.

(56) References Cited

U.S. PATENT DOCUMENTS

| | | | |
|---|---|---|---|
| 2005/0014325 A1 | 1/2005 | Aono et al. | |
| 2008/0273370 A1* | 11/2008 | Keller | G11C 11/5614 365/148 |
| 2009/0195300 A1 | 8/2009 | Schimmel et al. | |
| 2010/0006813 A1* | 1/2010 | Xi | H01L 27/2463 257/4 |
| 2011/0017977 A1 | 1/2011 | Bratkovski et al. | |
| 2012/0087173 A1* | 4/2012 | Linn | G11C 13/00 365/148 |
| 2012/0091420 A1* | 4/2012 | Kusai | G11C 11/5685 257/4 |
| 2012/0211719 A1* | 8/2012 | Haimoto | H01L 45/085 257/4 |
| 2013/0187116 A1* | 7/2013 | Tan | B82Y 10/00 257/4 |

* cited by examiner

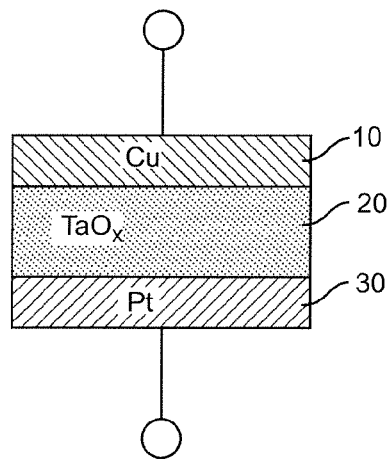
*Figure 1*
RELATED ART
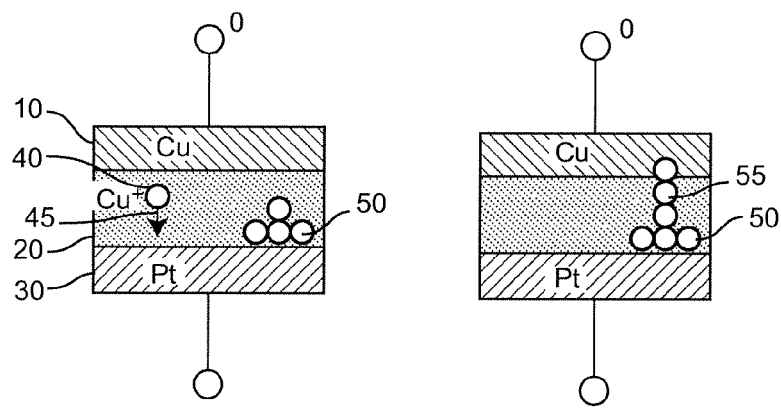
*Figure 2A*
RELATED ART
*Figure 2B*
RELATED ART

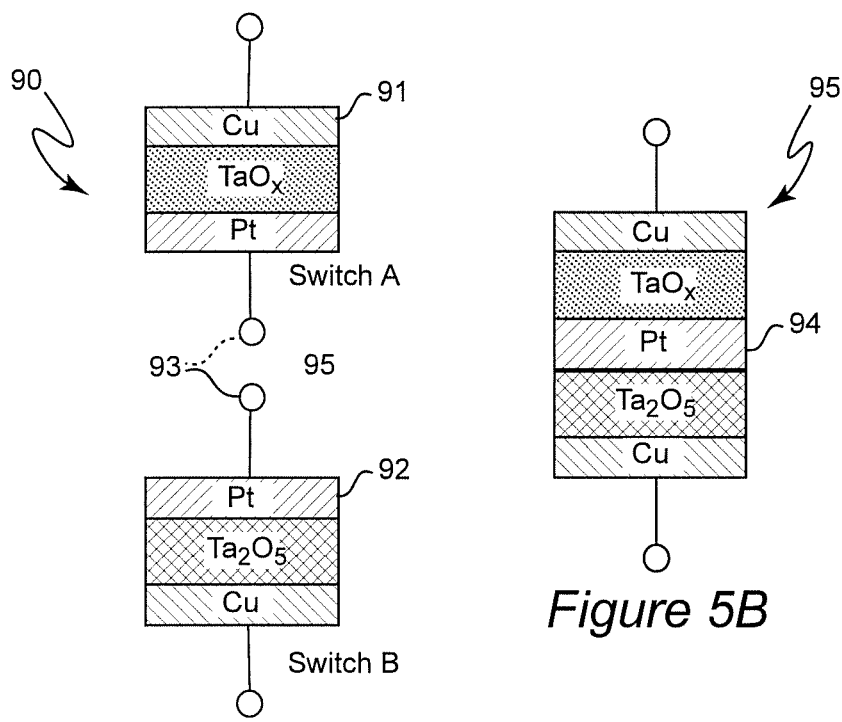
*Figure 5A*
*Figure 5B*
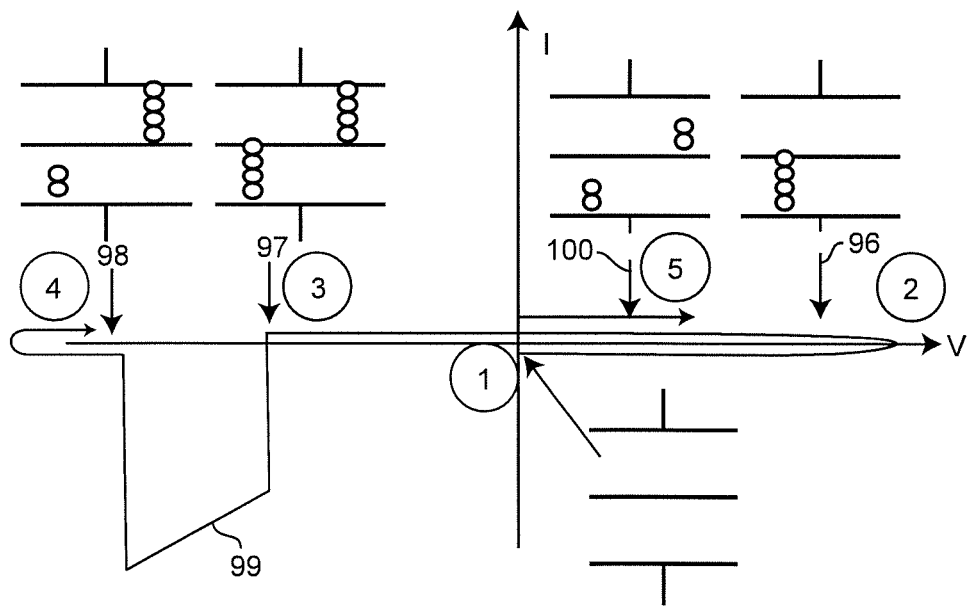
*Figure 6*

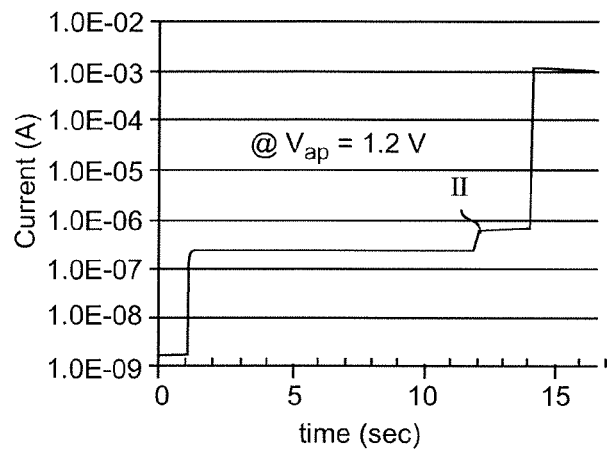
*Figure 33A*
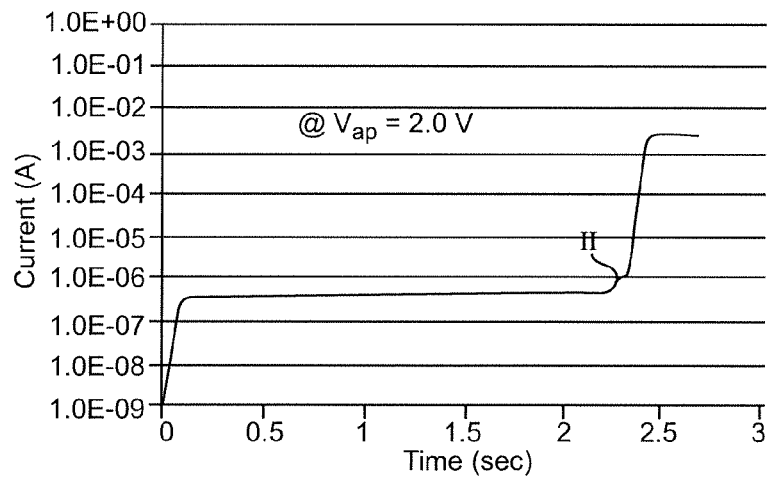
*Figure 33B*
$$I_1 = \frac{V_{ap}}{R_{off}(1) + R_{off}(2) + R_{off}(3)}$$
$$I_2 = \frac{V_{ap}}{R_{off}(1) + R_{off}(2) + R_{on}(3)}$$
$$I_3 = \frac{V_{ap}}{R_{off}(1) + R_{on}(2) + R_{on}(3)}$$
$$I_4 = \frac{V_{ap}}{R_{on}(1) + R_{on}(2) + R_{on}(3)}$$
*Figure 33C*

RESISTIVE VOLATILE/NON-VOLATILE FLOATING ELECTRODE LOGIC/MEMORY CELL

CROSS-REFERENCE TO RELATED APPLICATIONS

This application claims benefit of priority of U.S. Provisional Application 61/510,736, filed Jul. 22, 2011, U.S. Provisional Patent Application 61/539,575, filed Sep. 27, 2011, and U.S. Provisional Patent Application 61/671,875, filed Jul. 16, 2012, and International Application PCT/US12/47846 filed Jul. 23, 2012, all of which are hereby incorporated by reference in their entireties.

FIELD OF THE INVENTION

The present invention generally relates to electronic logic circuits and memory cells and, more particularly, to resistive, inert electrode devices which can be fabricated in densely integrated arrays.

BACKGROUND OF THE INVENTION

In semiconductor integrated circuits, smaller minimum feature size regimes (generally limited by lithographic resolution) and greater integration densities have been continually sought in order to reduce signal propagation time and increase switching clock rates as well as to improve noise immunity. High integration density also allows more functionality to be provided on a chip of given dimensions as well as substantial economy in manufacture to develop a given level of functionality. However, semiconductor integrated circuits based on transistor switches are approaching the theoretical limits on minimum feature size and maximum integration density. Further, increases in integration density and switching clock rates are requiring operation at very low voltages and currents in order to reduce heat dissipation requirements for logic circuits and so-called support circuits in storage devices operated at high clock rates. Even when the vast majority of transistors on a chip are formed at minimum feature size and operated at low voltages and currents, a substantial number of transistors on the chip must be formed at larger sizes and operated at higher voltages and currents for particular purposes such as input/output (I/O) drivers, on-chip voltage regulators, drivers for busses and large fan-out logic circuits and the like.

A particular problem is presented by the fact that many integrated circuit logic devices such as microprocessors require some storage which can be accessed in a very few extremely short clock cycles and thus the storage must be supplied on the chip. At the current state of the art, such storage for changeable data is provided as dynamic random access memory (DRAM) or static random access memory (SRAM) which are very different structures with very different properties. DRAM cells generally comprise only a small capacitor structure and a single transistor which can generally be formed substantially above the capacitor. Therefore, the memory cells can be very small and integration density is generally governed by the spacing between the capacitors that is needed for adequate isolation. However, such memory structures require refreshing at frequent intervals since the amount of change stored on a given capacitor structure is very small and the transistors as well as the capacitor structures are subject to leakage. Refresh operations can occupy a significant portion of the operation time of the DRAM and can limit access time. Sensing of the stored charge also requires a significant amount of time since such sensing is generally performed by using the stored charge (or lack of stored charge) to unbalance a bistable circuit which has been balanced between stable states and, after a read operation, the memory cell state must be rewritten. Therefore, response time of a DRAM is relatively slow.

Where memory response time is critical and must be performed rapidly, SRAMs are generally employed. Instead of storing data as charge on a capacitor structure as in DRAM cells, an SRAM cell is formed as a bistable transistor circuit, generally by cross-coupling the outputs and inputs of a pair of inverter circuits and including an additional pair of transistors for memory cell selection. Therefore such SRAM cells can be formed using four (with two additional passive resistors in the inverter circuits), six or eight transistors or more which infers a significant increase in chip area occupied by an SRAM cell. Additionally, in practice, the wiring to provide the cross-coupling of the inverters and the preferred orientation of the transistors (to have the conduction paths in the same direction for more uniform conduction characteristics) requires substantial further chip space. A layout for a six transistor SRAM cell that is considered optimally compact thus requires ten top twelve time the area required for a single transistor, which, as alluded to above, appears to be reaching the practical limits of size reduction.

There has also been continuing interest in non-volatile memories which are devices that can retain stored information substantially indefinitely without power being applied. This capability provides substantial advantage in terms of convenience and/or security since data, once written, is permanently stored on a device independently of any power supply which may be lacking or subject to power interruption such as discharge or changing of batteries in portable devices. So-called floppy disks were an early expedient for providing such a function but were limited in storage capacity while being somewhat larger than might be convenient and subject to damage. Optical disks provided greater storage capacity but were also relatively large and, like floppy disks, required a complex and expensive device for reading stored data while having the disadvantage of not providing for data to be changed.

More recently semiconductor-based non-volatile memories have been developed that are much smaller and can be read electronically without requiring a reading device. Such devices have been used widely in electronic devices such as digital cameras, cellular telephones and music players as well as in general computer systems, embedded systems and other devices that require persistent storage. Such devices often take the form of removable and portable memory cards and storage capacities of tens of gigabytes are available at low cost. However, semiconductor-based non-volatile memories such as flash memories and electrically erasable programmable read only memories (EEPROMs) require semiconductor structures and operations which are of limited scalability and integration density and not optimal in speed and are thus not well-suited to some applications.

Therefore, other types of structures are being investigated as potential alternatives to transistors for memory cells and some logic circuits, in particular, devices that can store data as differing resistance. Among these devices is a so-called phase change RAM (PCRAM) using a chalcogenide element as a variable resistor and a resistance RAM (ReRAM) that uses a transition metal oxide element. One structure that has been proposed in the last few years is a conductive bridge RAM (CBRAM) based on a capacitor-like structure also developed in recent years and sometimes referred to as a memristive switch or an ionic or atomic switch which changes resistance by precipitating metal cations to form a conductive bridge and ionizing the precipitated metal to destruct the bridge. The capacitor-like structure comprises two opposed plates of differing materials (e.g. metals) with a dielectric material between them that also exhibits electrolytic properties. One of the opposed plates is of an oxidizable material or metal (referred to as active) such as copper or silver and the other of a substantially inert conductive material or metal such as platinum or tungsten. A suitable dielectric material having electrolytic properties is tantalum oxide such as $Ta_2O_5$ or an oxygen deficient form thereof denoted by $TaO_x$. Such a structure is initially non-conductive. However, when a suitable bias voltage is applied to the respective opposed plates, ions of the active metal (e.g. $Cu^+$) are extracted from the active metal plate and drift-diffuse through the electrolyte and are stopped by and accumulate on the inert electrode. As ion drift-diffusion continues, active metal builds up on the inert electrode forming filaments (sometimes referred to as nanofilaments) that eventually reach the active metal electrode and the device abruptly becomes conductive. This process is reversible, causing the nanofilaments to rupture, returning some of the active metal ions to the active metal electrode and returning the switch to a non-conductive state, and, depending on the active metal and electrolyte, exhibits sharply defined voltage thresholds at which the conductive filament formation occurs.

As alluded to above, a structure comprising two such atomic switches formed back-to-back such that only a single inert electrode which can be allowed to electrically float is provided in common for both atomic switches has been proposed as a non-volatile memory (NVM) cell or logic circuit that does not require transistors as part of the storage structure. This structure is referred to as a resistive, floating inert electrode device or RFED. The potential for miniaturization is clear since it is only required that some finite but arbitrarily small area be provided and the two atomic switches can preferably be formed in a vertical orientation (the respective atomic switches being then referred to as upper and lower switches; a convention that will be used hereinafter for convenience but without any inference of relative orientation of the atomic switches being intended) and theoretically provide four electrical states (e.g. two different resistive states for each atomic switch) corresponding to two bits of information.

However, three of these states (e.g. where no nanofilaments are formed in either atomic switch or nanofilaments are formed in only one of the atomic switches) are difficult to distinguish in a two terminal device since all three states are of high impedance and the switch in which nanofilaments are formed (or ruptured) cannot be discriminated. Further, as proposed, such RFEDs cannot be formed as arrays where connection of RFEDs may cause so-called sneak circuits to other RFEDs through the inert electrode or dielectric electrolyte. Such sneak circuits can also be caused in an array of RFEDs fabricated in an optimally compact cross-bar configuration by the easily distinguishable fully conductive state where nanofilaments exist in both atomic switches of an RFED. Additionally, relatively strong electric fields are required to cause sufficient electromigration or drift-diffusion to form or rupture nanofilaments. Also, as a practical matter, volatility/persistence of storage is relatively unstable; tending to vary with the past writing history of the individual RFED cell. By the same token writing operation to an RFED cell may require extended highly variable periods of time; again depending on the previous storage state of the RFED cell. The RFED cell also tends to generate pulses if the set and reset thresholds present only a small operating window. In conventional circuitry, a large number of transistors is needed to generate a current or voltage pulse. With an RFED, only one highly scalable device is needed. Due to at least these problems which have been largely intractable, RFEDs have not been widely studied or developed. Therefore, at the current state of the art, RFEDs do not provide a practical alternative to transistors in logic circuits and storage devices.

SUMMARY OF THE INVENTION

It is therefore an object of the present invention to provide an RFED structure that can be fabricated in a compact array and operated as a practical storage device that does not require transistors and can be fabricated at an arbitrarily small minimum feature size in optimally compact arrays.

It is another object of the invention to provide RFED cells that can be operated as either volatile memory (SRAM or DRAM) cells or as non-volatile memory cells in the manner of flash memory or floating gate transistor devices.

It is another further object of the invention to provide logic circuits comprising RFEDs that can be formed at small size in a compact array that achieve accelerated learning, and partial or complete unlearning as adaptive circuits that are highly simplified in configuration and connection and occupy only a relatively few RFED sites in a compact cross-bar array of RFEDs.

In order to accomplish these and other objects of the invention, a method of operating an atomic switch is provided comprising steps of applying a threshold voltage across the atomic switch to render said atomic switch conductive, and limiting current through the atomic switch to a level less than a current required to render the atomic switch non-conductive.

In accordance with another aspect of the invention, an atomic switch is provided comprising an inert electrode, a δ-copper layer on said inert electrode, an active or inert electrode spaced from the δ-copper later, and a solid dielectric/electrolyte filling a space between the δ-copper layer and the active or inert electrode.

In accordance with a further aspect of the invention, a logic device is provided comprising three or more serially connected atomic switches, wherein the three atomic switches exhibit OFF resistances, ON resistances and reset currents that differ from each other.

BRIEF DESCRIPTION OF THE DRAWINGS

The foregoing and other objects, aspects and advantages will be better understood from the following detailed description of a preferred embodiment of the invention with reference to the drawings, in which:

FIG. 1 is a schematic cross-sectional view of a device referred to as an atomic, ionic or memristive switch, FIGS. 2A and 2B illustrate the operation of the atomic switch of FIG. 1, FIGS. 3A and 3B illustrate the current/voltage (I-V) characteristics of the atomic switch of Figure as the switch made conductive and non-conductive, respectively, FIGS. 5A and 5B illustrate the structure of a resistive floating electrode device (RFED) from two atomic switches, FIGS. 6, 7A and 7B illustrate programming of the RFED of FIG. 5A or 5B.

FIGS. 32, 33A, 33B and 33C illustrate an exemplary logic array of atomic switches that provide for controlled learning and unlearning programmable states.

DETAILED DESCRIPTION OF A PREFERRED EMBODIMENT OF THE INVENTION

Figure 3A:
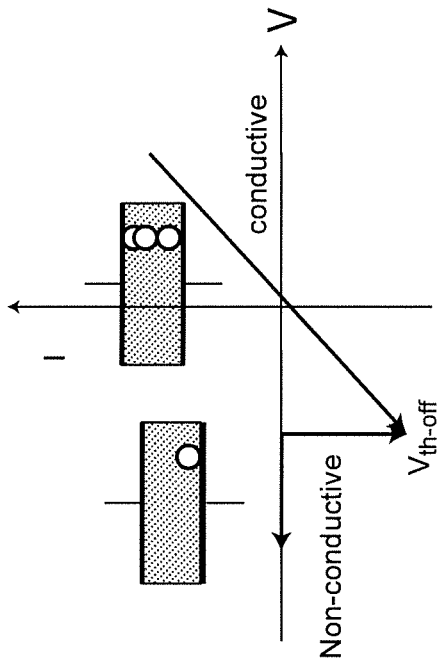

Referring now to the drawings, and more particularly to FIG. 1, there is shown an exemplary structure of a so-called atomic, ionic or memristive switch. Since this switch is of exemplary materials and other structures may be made to operate in a similar fashion, and the exemplary materials illustrated have been chosen to facilitate an understanding of the invention and relationship of preferred features thereof no portion of FIG. 1 (or FIG. 2A, 2B, 3A or 3B is admitted to be prior art in regard to the invention and these illustrations have, accordingly, been designated as "Related Art".

The atomic switch, as illustrated in FIG. 1 comprises a capacitor-like structure with an active metal plate 10 formed of, for example, copper, a dielectric material 20 that also exhibits electrolytic properties such as oxygen deficient tantalum oxide ($TaO_x$) and an inert metal plate 30 formed of, for example, platinum. Electrical connections are made to the opposed active metal and inert metal plates as schematically illustrated. However, the details of electrical connections are of no importance to an understanding of the invention in accordance with its basic principles but only in regard to forming a compact array of RFEDs as will be discussed in greater detail below.

When a suitable bias voltage is applied to the opposed plates, ions 40 of the active metal are extracted from the active metal plate and drift-diffuse through the dielectric/electrolyte 20 as depicted by arrow 45 in FIG. 2A. These ions are stopped by and collect on the inert electrode 30 and form a deposit 50. As the process continues, the electric field strength in dielectric/electrolyte 20 will be increased near conductive clustered copper deposit 50 and further preferential ion deposition thereon will be enhanced; causing the formation of nanofilament 55 as shown in FIG. 2B which eventually forms a conductive bridge between the two opposed plates and results in a low impedance path between the opposed plates. It should be noted, for a oxygen deficient dielectric/electrolyte such as TaOx (but not others, such as stochastic materials, that are not oxygen deficient) as illustrated, there will be a similar drift-diffusion and collection of doubly negative charged oxygen vacancies from the electrolyte toward the active metal electrode that can similarly form a conductive bridge between the opposed plates. Even so, the charge transfer is extremely small and the conductivity remains substantially zero until a conductive bridge is formed. The mechanism of oxygen depletion drift-diffusion may or may not be present, depending on the choice of dielectric/electrolyte and is only mentioned here for reference in the discussion of variant embodiments of the invention as will be provided below.

Figure 3B:
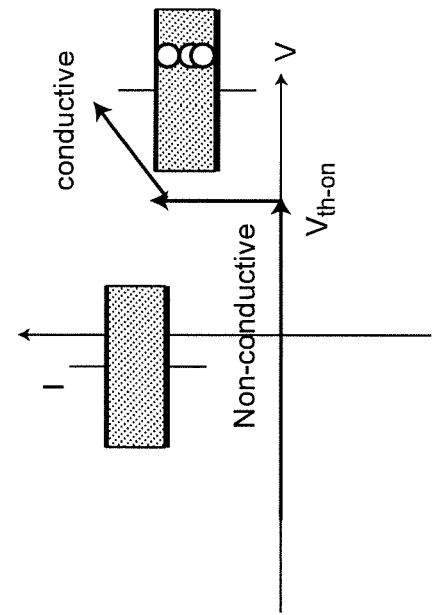

The alteration of electrical properties of the atomic switch are illustrated in FIGS. 3A and 3B. FIGS. 3A and 3B are graphical plots of voltage applied across the atomic switch and the resulting current through the atomic switch (referred to as I-V characteristics) with schematic depiction of the formation and rupturing of a nanofilament bridge to aid in visualizing the operation of the atomic switch to result in the depicted I-V characteristics illustrated. Initially, before any voltage is applied and before any active metal extraction or drift-diffusion occurs, the atomic switch is non-conductive for any small bias voltage that may be applied to the opposed plates 10, 30, as depicted by the horizontal body of arrow 60 in FIG. 3A. If the voltage is swept to a negative voltage, the current will remain substantially zero until a critical voltage $V_{th-on}$ is reached; at which voltage active metal ions will be extracted from plate 10, drift-diffuse through the dielectric/electrolyte 20 and collect on inert electrode 30 to form a conductive nanofilament that form a conductive bridge between the opposed plates. At this point, the atomic switch becomes abruptly conductive as depicted by arrow 65 in FIG. 3A. For greater bias voltages after this point, the electrical behavior of the atomic switch will be ohmic as indicated for larger negative bias voltages by arrow 70 of FIG. 3A and for smaller negative and small positive bias voltages by arrow 75 in FIG. 3B. However, as the bias voltage becomes positive, the drift-diffusion of active metal ions toward the inert electrode ceases (and may, in some cases, spontaneously reverse) and as positive bias voltage is increased, active metal ions may tend to drift-diffuse in the opposite direction, returning to active electrode 10, and at some positive voltage bias, $V_{th-off}$, the nanofilaments will rupture; causing the atomic switch to become non-conductive once again as depicted by arrow 80 in FIG. 3B although some drift-diffusion may continue for positive bias until a significant portion of the active metal ions are returned to active electrode 10.

Figure 4A:
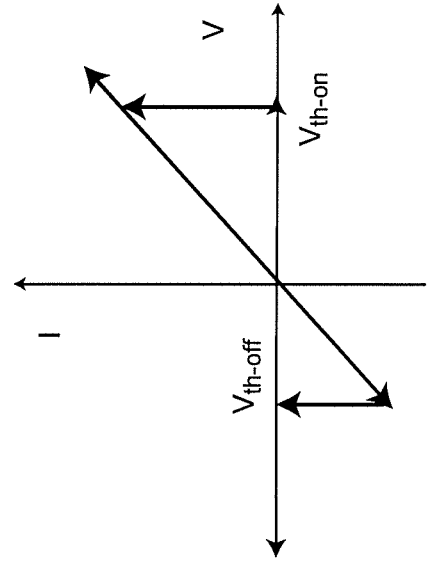
FIGS. 4A and 4B illustrate alteration of the hysteresis characteristics of the atomic switch by use of different electrolyte and/or electrode materials.
Figure 4B:
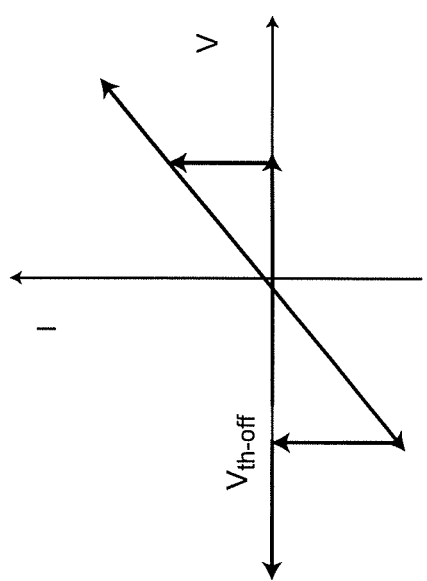

The bias voltage excursions for performance of a complete switching cycle of an atomic switch as shown in FIGS. 3A and 3B are depicted in FIG. 4A. However, ohmic behavior for larger negative bias voltages 70 required for turn-on as illustrated in FIG. 3A are omitted in FIG. 4A, for clarity. Arrows 65 and 80 at $V_{th-on}$ and $V_{th-off}$, respectively, are the two characteristics of the hysteresis exhibited by the atomic switch. It is important to observe that the voltages at which these thresholds occur are determined by the material properties of the active electrode metal (such as work function and the parameters of the redox reaction at the type of the active metal and electrolyte interface) and dielectric/electrolyte and its thickness. That is, if a different dielectric/electrolyte and suitable active metal electrode are chosen, the characteristic voltages of the hysteresis will be qualitatively the same (e.g. producing a "bow-tie" array of arrows 65-80) but the respective threshold voltages will have different values. Therefore, it is desirable, in RFED devices as will be discussed below, to shift the characteristic threshold voltages to the right (e.g. to combine the negative voltage hysteresis with part of the positive voltage hysteresis as shown in FIG. 4B, particularly when two atomic switches are combined to form a RFED in order to be able to form bridges in both the upper and lower atomic switches of the RFED and to have the bridges exist concurrently and form and rupture in an advantageously controllable manner). It should be appreciated in this regard that when two atomic switches are connected in electrically opposing relationship (e.g. in structurally opposite orientations), referred to as anti-serial, or formed with a common inert electrode, shifting of the threshold voltages to the right, as shown, for either or both of the atomic switches effectively expands the voltage range of ohmic behavior when bridges have been formed in both atomic switches, increases the write and/or erase threshold for improved noise immunity, particularly when the device is used as a memory device and may reduce the likelihood of spontaneous rupturing of the nanofilaments when the bias voltage is high. Such a threshold shift can also be altered by electrode spacing either alone or in combination with choice of dielectric/electrolyte and/or electrode materials but increases in electrode spacing will reduce the speed with which the development of a nanofilament bridge between the electrodes can be accomplished.

Referring now to FIG. 5A, an exemplary preferred structure of a resistive floating electrode device (RFED) 90 in accordance with the invention will now be discussed. FIG. 5A schematically illustrates two atomic switches of similar construction but which include different exemplary dielectric/electrolyte materials. Specifically, in this example, atomic switch A, 91, is identical to the exemplary atomic switch discussed above in connection with the illustrations of FIGS. 1-4A. Atomic switch B, 92, is of similar construction but includes stochastic tantalum oxide, $Ta_2O_5$, rather than oxygen deficient tantalum oxide, $TaO_x$, as the dielectric/electrolyte. Accordingly, atomic switch B, 92, will exhibit a shift in voltage thresholds as compared with atomic switch A, 91, for forming and rupturing the nanofilament bridges as discussed above in regard to FIG. 4B. Atomic switch B, 92, is also illustrated in an inverted orientation relative to atomic switch A, 91, with the inert electrode at the top and the active electrode at the bottom. This inversion of orientation also reverses the polarity of bias voltage applied to atomic switch B relative to the voltage applied to the overall RFED device. It should be noted that the connection between single switches is provided by the merging of the two inert (Pt) electrodes into one common, floating inert electrode. However, the two inert electrodes can be connected externally in any convenient way to realize an electrically equivalent RFED structure. These two atomic switches can be connected as shown by dashed line 93 to Rain an RFED. One preferred form of such a connection is simply to provide a single inert electrode that is common to both atomic switches, as shown in FIG. 5B to form RFED 95. While the inert electrode 94 is illustrated as comprising platinum throughout its volume, it should be understood that electrode could be an alloy or other material or even a layered structure of different substantially inert conductive materials for purposes such as adjusting thresholds as discussed above in connection with FIG. 4B, or to develop other desired electrical or physical properties of the RFED.

Referring now to FIG. 6, operation of a RFED such as that depicted in FIG. 5B will now be discussed. As with FIGS. 3A and 3B, FIG. 6 is a graphical plot of voltage applied to the RFED and the resulting current therethrough with inset schematic depictions of the RFED and nanofilament bridge formation and rupture. As in FIG. 6, before any bias voltage is applied to the RFED, no nanofilament bridges will have been formed and the state of the RFED will be as depicted by circle 1. As a positive bias is applied, at a threshold 96, a first nanofilament bridge will be formed in one of the atomic switches of the RFED. However, since the nanofilament bridge is formed in only one of the atomic switches as depicted at circle 2, the RFED remains non-conductive and the current substantially zero even at positive bias voltages substantially greater than the threshold voltage (but below a breakdown voltage of the entire RFED device or of the individual atomic switches). (Slight variation from zero current is depicted to allow the voltage excursion to be more easily followed.) If the bias voltage is then swept to a negative voltage, when a negative threshold 97 is reached, a nanofilament bridge is formed in the other atomic switch as depicted at circle 3 and the RFED becomes conductive. (The second bridge is formed at a bias polarity opposite to the threshold causing formation of the first bridge since the atomic switches are connected anti-serially.) The first monofilament bridge formed at threshold 96 remains in place due to the adjustment (e.g. increase or shift to the right) of thresholds as discussed above in connection with FIG. 4B. If the bias voltage is swept to even higher negative voltages, threshold 98, referred to as the switch A reset voltage, $V_{th-reset(A)}$, is reached and the first nanofilament bridge is ruptured as shown at circle 4 and the RFED again becomes non-conductive. (The difference in thresholds between circle 3 and circle 4 and the opposite effect achieved at the respective thresholds is due to the combination of threshold adjustment of one or both atomic switches as well as the anti-serial connection alluded to above.) Between the states of the RFED developed at circle 3 and circle 4 while the RFED is conductive, the RFED will exhibit ohmic characteristics as shown at 99 on the I-V plot. If the bias voltage is again swept to a positive voltage, the second monofilament bridge will be ruptured at a threshold 100 which is less than threshold 96, as shown at circle 5, again because of adjustment of thresholds of the respective atomic switches as discussed above.

Figure 7A:
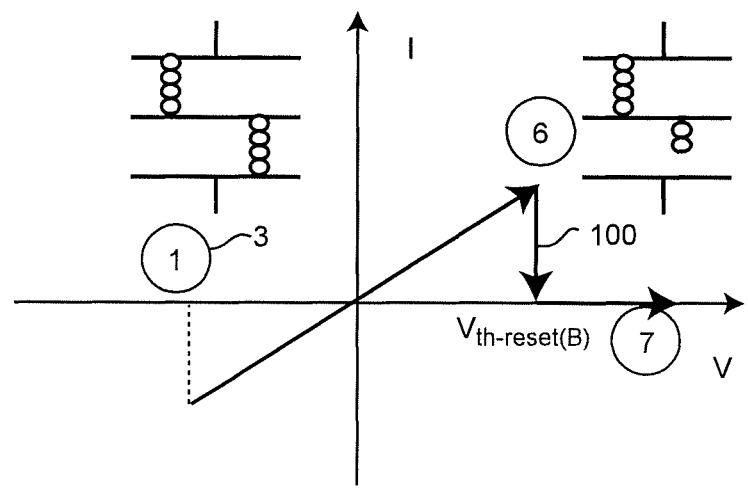
Figure 7B:
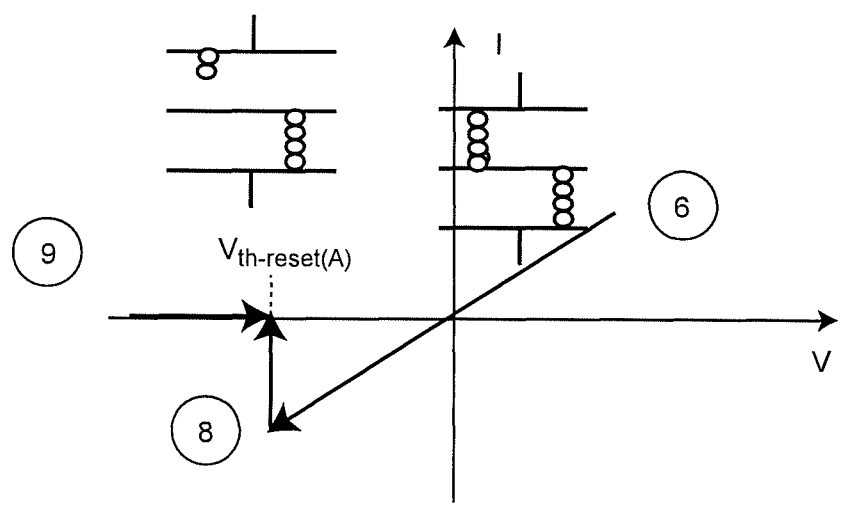

Alternatively, as shown in FIG. 7A, if threshold 98 is not reached after the RFED is rendered conductive at the state of circle 3 of FIG. 6, the RFED will exhibit ohmic behavior even at positive voltages below threshold 100 (e.g. for voltage excursions between the voltages indicated by circle 3 of FIG. 6 and circle 6 of FIG. 7A since the state of the RFED is the same as that achieved at circle 3 of FIG. 6. However, at a bias voltage threshold 100, referred to as a switch B reset voltage, $V_{th-reset(B)}$, the second nanofilament bridge to be formed at state circle 3 of FIG. 6 is ruptured while the first Nanofilament bridge to be formed at the state of circle 2 of FIG. 6 remains in place, as shown at circle 7. Conversely, as shown in FIG. 7B, between states indicated by circle 6 and circle 8, ohmic behavior will be exhibited at positive or negative bias voltages below $V_{th\text{-}reset\text{-}B}$ and above (e.g. less negative) than $V_{th\text{-}reset(A)}$ while at that threshold, the first nanofilament bridge to be formed is ruptured as depicted at circle 9. Therefore, it is seen that once the RFED is rendered conductive, either nanofilament bridge can be selectively ruptured.

It will be recalled from the foregoing that, while four storage states of an RFED are theoretically possible and could theoretically provide the storage equivalent of two bits in a single RFED, the conductive state cannot be used when plural RFED devices are connected in and accessed through a matrix type of connection arrangement since the conductive state of an RFED will cause a sneak connection paths to other RFEDs in the other rows and columns of the matrix. It will also be recalled that the three non-conductive states of an RFED cannot be reliably distinguished and cannot be discriminated in any practical way. Moreover, without shifting of threshold of one or both atomic switches of an RFED in accordance with the RFED of the invention, the development of nanofilament bridges in both of the atomic switches cannot be reliably achieved and thus there is no selectivity, much less reliability, in forming a single nanofilament bridge in only one of the atomic switches to allow the two "single bridge" states of an RFED to be used as storage states or, even if selectively achieved, to be discriminated. The RFED in accordance with the invention not only allows the two "single bridge" states to be reliably and selectively achieved, as discussed above, but exploits the conductive state to enhance the writing operation to the RFED and discriminating between the two "single bridge" states as will be discussed below, while limiting the duration of the conductive state to periods where possible sneak circuit paths are of no effect since all unselected RFED cells are in one of the "single bridge" states and, hence, non-conductive, allowing fabrication of RFEDs in highly compact matrix arrays; an exemplary preferred form of which will now be discussed in connection with FIGS. 8A and 8B.

Figure 8A:
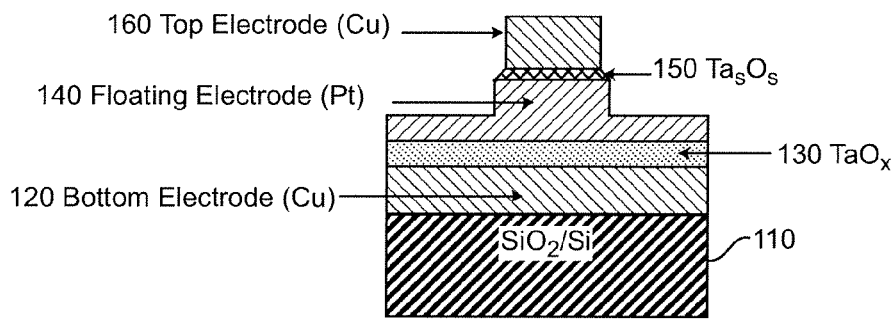
FIG. 8A is a cross-sectional view of an RFED cell as fabricated in a matrix array.

FIG. 8A illustrates a cross-section of a RFED cell construction suitable for matrix fabrication. In this example, the RFED is inverted as compared with FIG. 5B. The orientation of the RFED in accordance with the invention is not important to the understanding and practice of the invention in accordance with its basic principles but can provide flexibility and convenience in design for some applications where more than two atomic switches are provided in a stack for artificial intelligence and adaptive circuit applications and the like as will also be discussed in greater detail below in regard to several perfecting features of the invention.

Figure 8B:
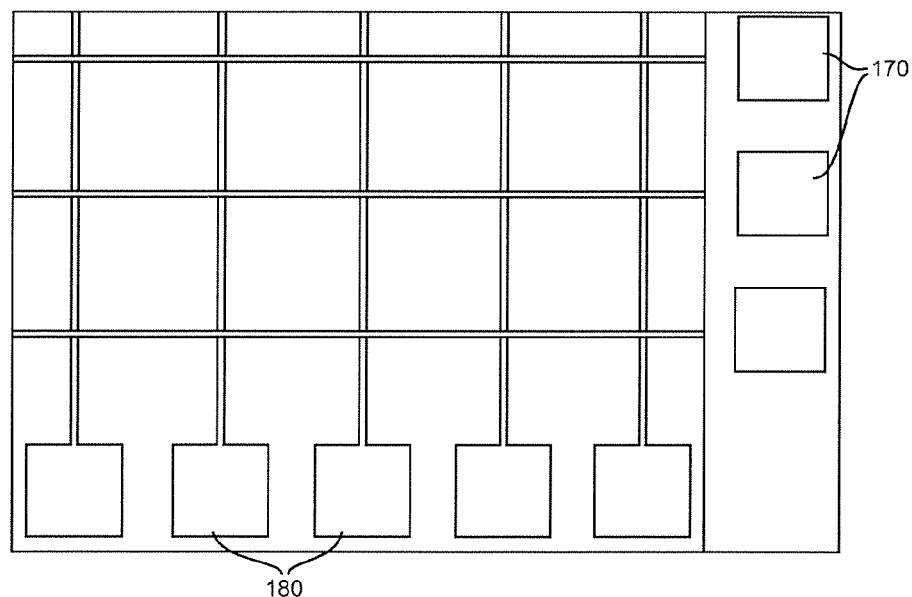
FIG. 8B is a plan view of a portion of a cross-bar matrix array of RFEDs.

Specifically, an insulative substrate (or layer on a substrate or some other structure) such as of thermally oxidized silicon wafer is provided on which a bottom active electrode 120 such as copper is deposited and patterned into elongated conductors extending in the direction of the plane of the page and terminating in connection pads 170 as shown in the plan view of a compact cross-bar matrix provide in FIG. 8B. A first dielectric/electrolyte layer 130 is then deposited on the active electrode 120. The thickness of the dielectric/electrolyte layer is preferably kept small (e.g. on the order of a few tens of nanometers) to allow conductive bridges to be rapidly formed and ruptured. No patterning of layer 130 is required but could be provided if desired. Inert electrode 140 is then deposited as a blanket layer and then patterned into discrete (e.g. rectangular) areas so that contact with any other electrically conductive structure can be avoided. These areas can be made as small as is reasonably feasible for acceptable manufacturing yield. At the present state of the art, a transverse dimension of these areas can be as small as a few nanometers and smaller dimensions are foreseeable. Insulating material can be deposited or grown in the space between the bodies of inert electrode material for isolation, if desired by known and well-understood processes in accordance with the chosen insulating material. The second dielectric/electrolyte material 150 is then deposited over the bodies of inert electrode material. Again, this dielectric/electrolyte layer is kept to substantially the same dimensions as the first dielectric/electrolyte layer 130 (but either thickness could be varied to trim capacitance) and patterning is not necessary but could be performed, if desired. Finally, another active electrode material layer is deposited and patterned to form elongated conductors extending, for example, perpendicular to the plane of the page and terminating in connection pads 180 as shown in FIG. 8B. The method of deposition of the electrode and dielectric/electrolyte layers is not at all critical to the practice of the invention and many known and foreseeable techniques are considered suitable. However, sputtering or electron beam evaporation is currently considered somewhat preferable for good thickness control of the dielectric/electrolyte layers.

Figure 9A:
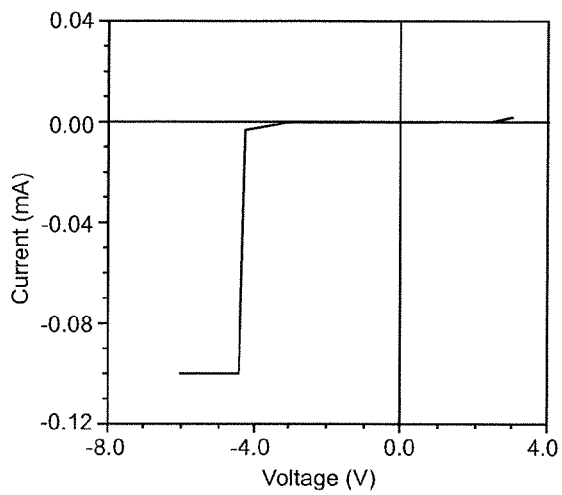
FIGS. 9A, 9B and 9C show experimentally derived electrical characteristics of the RFED of FIG. 8A, FIGS. 10A and 10B schematically illustrate cross-sections of variant embodiments of an RFED.
Figure 9B:
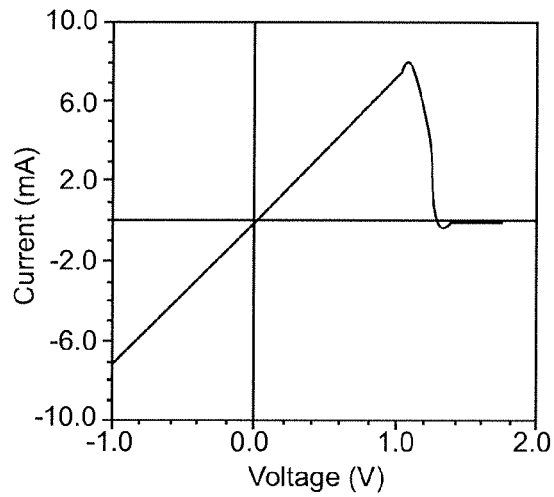
Figure 9C:
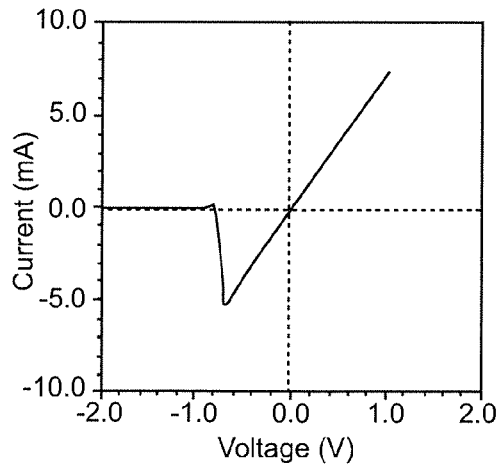

FIGS. 9A, 9B and 9C show experimental results of the electrical behavior of an exemplary RFED constructed as shown in FIGS. 8A and 8B. FIG. 9A shows a sweep from zero volts to $V_{th\text{-}set\text{-}A}$ (at about 3V) during which the first bridge is created as discussed above in connection with FIG. 6, followed by sweeping the voltage to a negative voltage. At a negative threshold of about −4.3 V an abrupt increase in negative current is observed as the second bridge is formed at $V_{th\text{-}set\text{-}B}$ and the RFED is rendered conductive. As shown in FIG. 9B, ohmic behavior is observed at small bias voltages between the two thresholds. This ohmic behavior at small bias voltages is also shown in FIG. 9C for voltages between −0.9V and 1V. However, as the voltage is swept to −2V, at a bias voltage of about −0.9V the current abruptly drops to zero, indicating the rupture of the nanofilament bridge in atomic switch A. Similar behavior is observed for larger positive bias voltages; indicating good experimental agreement with the RFED structure and programming operation as discussed above.

The difference in voltage between the initial formation of nanofilament bridges, referred to as a forming voltage, and the rupturing thereof as well as a reduced voltage for reformation of nanofilament bridges is due to the fact that a higher voltage is required to initially form the entire bridge while some portions of the bridge will already exist when the bridge is re-formed and the fact that once one nanofilament bridge is in place, the inert electrode is no longer floating, whereas before any nanofilament bridge is formed, the RFED will constitute a capacitive voltage divider and the floating inert electrode will assume a voltage near one-half of the bias voltage applied to the RFED, depending of the dielectric constant of the dielectric/electrolyte(s) and the electrode spacing. When both nanofilament bridges are in place, the RFED will effectively be a resistive voltage divider.

Figure 10A:
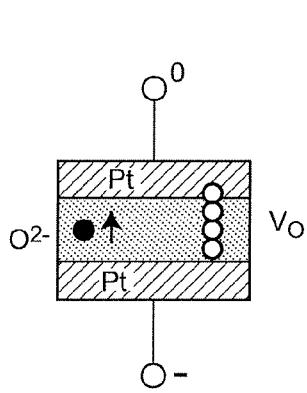
Figure 10B:
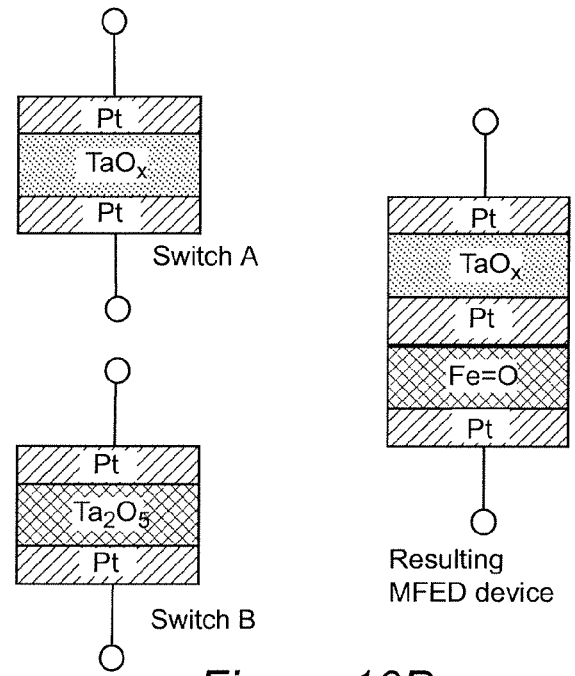

Referring now to FIG. 10A, a variant form of atomic switch that can be employed in a RFED in accordance with the invention is shown. In this case, both electrodes are of an inert material such as platinum. The dielectric/electrolyte can be any of a wide variety of insulative oxides such as iron oxide (FeO). When a bias is applied, doubly charged oxygen vacancies, illustrated by open circles, are created and drift-diffuse in the same manner (but opposite direction) as described above for active metal ions to form connecting, conductive bridge(s). This variation of atomic switch structure effectively mixes nanofilament conductive paths with metal ions and oxygen vacancies such that resistive switching takes place at the entire interface between the oxide and the electrode. An exemplary RFED incorporating such an atomic switch is shown in FIG. 10B using a combination of the atomic switch of FIG. 1 and the atomic switch of FIG. 10A. These illustrations should be considered as exemplary of other variations of the RFED in accordance with the invention which could include atomic switches with the same dielectric/electrolyte material but employing different electrode materials or electrode spacing, use of other dielectric/electrolyte materials such as aluminum oxide, using a layered structure of different materials (e.g. $Ta_2O_5/TaSiOx/Al_2O_3$) for the dielectric/electrolyte, providing one atomic switch as a unipolar mode switch in which rupturing of the conductive filament is due to Joules heating that is independent of current direction or any combination of such variations.

As briefly discussed above, in known RFEDs (e.g. without threshold shift of one or both atomic switches) the fully conductive state with two conductive bridges in place could not be reliably achieved or maintained since the bias voltage polarity (and slight current) required to form the second bridge, as discussed above, causes active metal (and/or oxygen vacancies) to be removed from the first bridge, leaving only a very small and critical voltage window, or no voltage window at all, for formation of the second bridge without rupture of the first bridge. In other words, in an RFED, the set threshold for one atomic switch may be very close to or the same as the reset threshold for the other atomic switch. In any event, as noted above, the conductive state or an RFED could not be used as a memory state when a plurality of RFEDs are fabricated in a matrix array and that the three possible non-conductive states could not be discriminated in any way that is practical for a high capacity memory device formed at high integration density and providing write and read times comparable to transistor-based memory structures. The reliable and selective formation of conductive bridges in both atomic switches in an RFED however, can be achieved by adjustment of threshold voltages of the two atomic switches, as discussed above. However, this capability does not solve the problem of discriminating which of the two atomic switches has a conductive bridge in place.

This problem is solved in accordance with the invention by the use of a compliance current which not only allows discrimination of which of the two atomic switches has a conductive bridge in place while the RFED remains in a non-conductive state so that the state of the RFED, when used as a memory device or in some logic applications, can be read but also allows selective formation of a conductive bridge in either atomic switch of an RFED and for that state to be read in an RFED. Both for simplicity of description and to demonstrate the robustness of the compliance current technique, the following description will be made with reference to an RFED in which the set and reset thresholds of both atomic switches are identical. However, the compliance current switching technique is identically applicable to RFEDs where the respective thresholds of the atomic switches are adjusted to be different. Additionally, the compliance current technique can provide decoupling of set and reset thresholds even when very similar and thus a small or non-existent operation window between the threshold voltages is avoided. Further, the compliance current technique can be advantageously exploited to achieve additional electrical effects in connection with a further perfecting feature and embodiment of the invention as will be explained below.

Essentially, the compliance current technique is a limitation on the current allowed to pass through the RFED when in the ON or conductive state to a level below the reset current and provides for maintenance of the ON state indefinitely while allowing for a variable voltage drop across the device. The ON state can then be changed to the 1 or 0 state by exceeding a threshold voltage for bridge formation but not exceeding the current above the reset current for either atomic switch.

Figure 11:
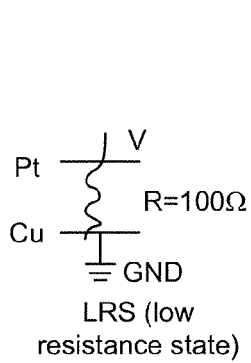
FIG. 11 illustrates operation of an RFED in accordance with the invention.
Figure 11:
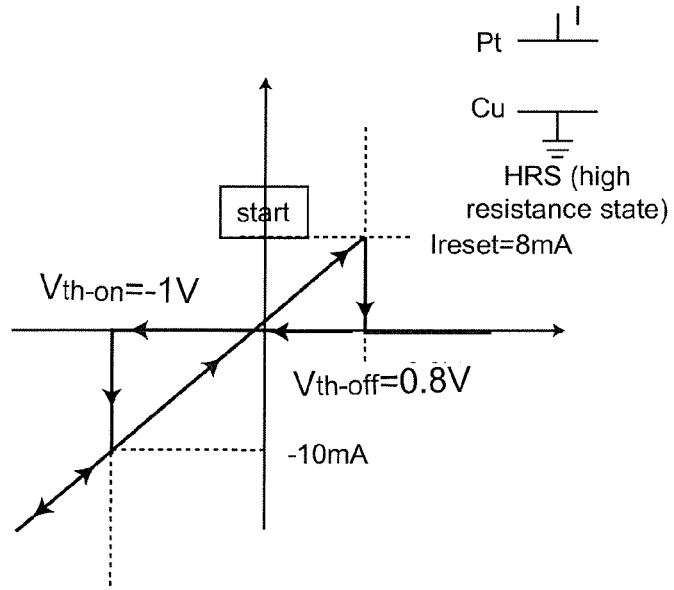

To convey an understanding of the compliance current technique of operating a RFED, reference is first made to FIG. 11 illustrating an exemplary hysteresis characteristic of an atomic switch. This illustration essentially combines FIGS. 3A and 3B as discussed above. In the following discussion, $V_{th\text{-}on}$ and $V_{th\text{-}off}$ are used for a single switch whereas $V_{set}$ and $V_{reset}$ are used to refer to the entire RFED. $V_{set}$ is approximately $V_{th\text{-}on}$. However, $V_{reset}$ is about $2V_{th\text{-}off}$.

From an initial non-conductive state at zero volts, the voltage can be swept through increasingly negative voltages until a set threshold, $V_{set}$, is reached; at which point a conductive bridge will be formed and the atomic switch will become conductive and exhibit ohmic behavior for all negative bias voltages and small positive bias voltages below a reset threshold, $V_{reset}$. At $V_{th\text{-}off}$, the conductive bridge will be ruptured and the atomic switch will become non-conductive for all voltages above $V_{th\text{-}on}$. It should be noted that the hysteresis characteristic is slightly asymmetrical, as is typical of atomic switches of various constructions and the set and reset currents as well as the set and reset voltage thresholds will differ accordingly. In this regard, it should be noted that the set voltage that is applied must be smaller in magnitude than the reset voltage since the RFED could not be operated as a storage device if that were not the case since an ON state could not be achieved and the reset current achieved if the first conductive bridge is ruptured before the second conductive bridge is formed. The extent to which the reset threshold magnitude exceeds the set threshold magnitude is the operating window of the RFED.

Figure 15:
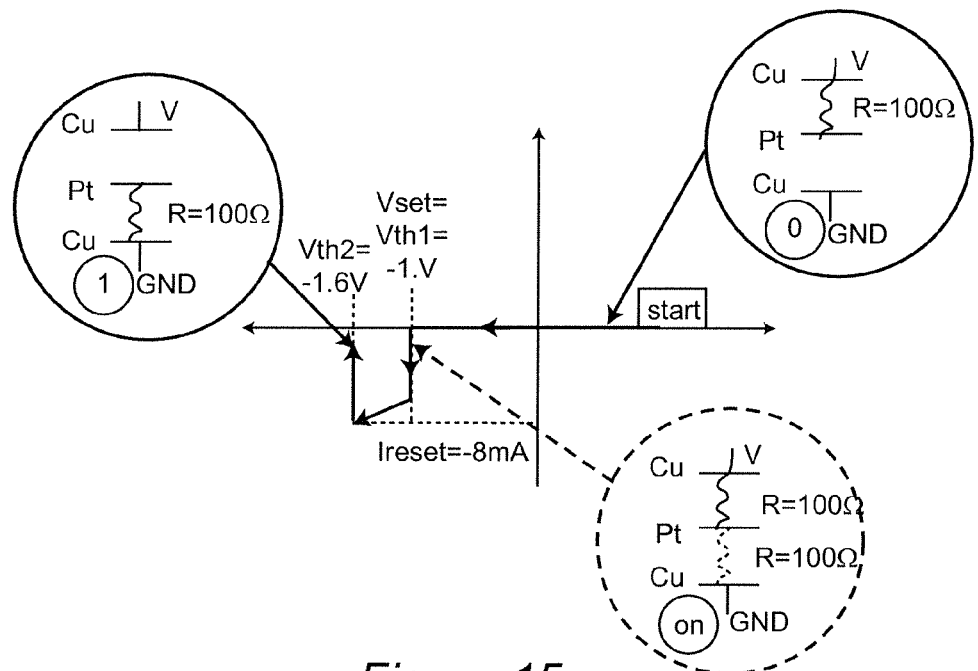
FIGS. 15 and 16 illustrate operation of an RFED with application of a compliance current.

It should also be noted in this regard, that if the necessary condition of the magnitude of the reset voltage being greater than the magnitude of the set threshold, when one conductive bridge exists the voltages at which the second bridge will be formed is above the set threshold due to the voltage drop across the existing conductive bridge when the current is increased as the conducting bridge is formed. This increase in the set voltage reduces the size (in volts) of the operating window of the RFED even though the magnitude of the reset voltage may approach twice the magnitude of the set voltage. This effect is also illustrated in FIG. 15.

Figure 12:
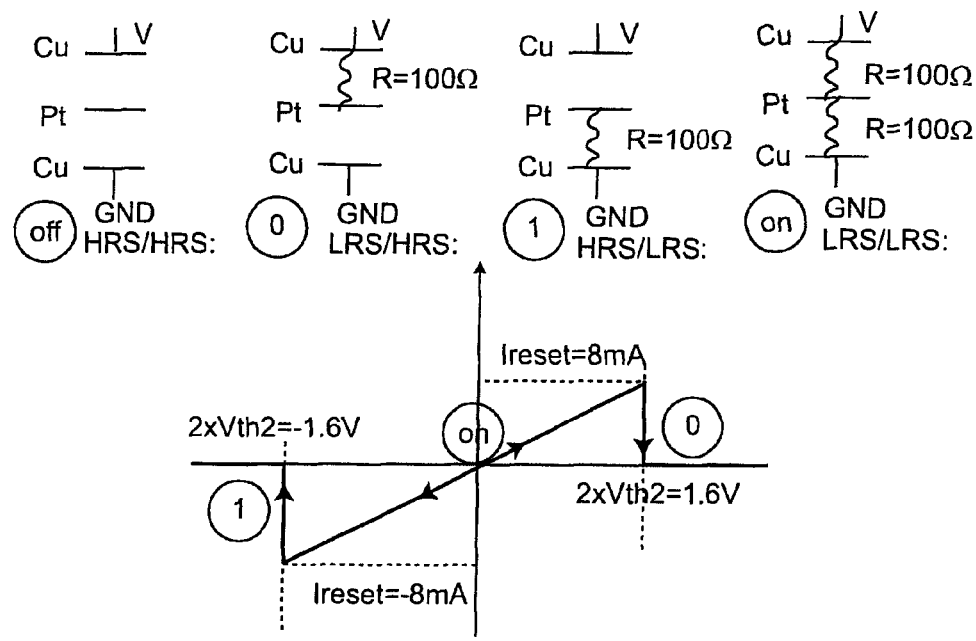
FIG. 12 illustrates possible states of an RFED.

Referring now to FIG. 12, the four potential states of a RFED are illustrated. The initial state in which both the upper and lower atomic switches have a high resistance state (HRS/HRS) is referred to as the OFF state which will not be resumed after a conductive bridge is formed in either the upper or lower atomic switches. The 0 state is defined as a conductive bridge and low resistance state (LRS) existing in only the upper but not the lower atomic switch and is denoted by the legend (LRS/HRS). Conversely the 1 state is defined at a state in which a conductive bridge and LRS exists only in the lower atomic switch but not the upper atomic switch and is denoted by the legend HRS/LRS. Finally the ON state is defined as a state in which a LRS and conductive bridge exists in both the upper and lower atomic switch such that ohmic behavior will be exhibited. The I-V plot for the 0, ON and 1 states of the RFED for either of the atomic switches without the application of compliance current is also illustrated in FIG. 12.

Figure 13:
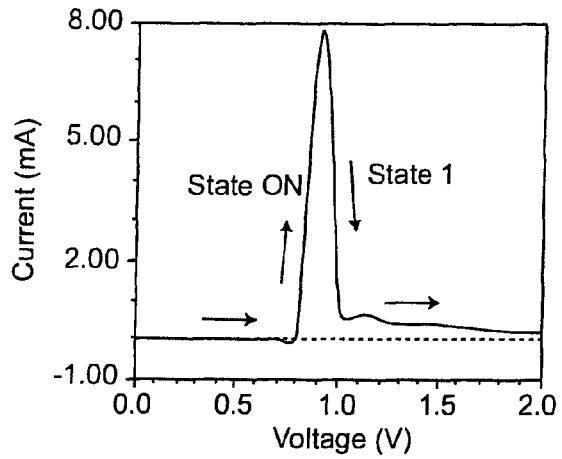
FIG. 13 illustrate an I-V plot of an RFED with a small operating range or window.

The I-V plot for the entire RFED during a voltage sweep is shown in FIG. 13. From an initial zero (magnitude) voltage, the voltage is increased until the set voltage (exceeding the set threshold as noted above) is reached the RFED becomes abruptly conductive and at only a slightly greater voltage magnitude becomes abruptly non-conductive again over a voltage excursion of a small fraction of a volt. This behavior can be frequently observed in an experimental arrangement and is indicative of the criticality of the voltage operating window of an RFED which is due to the fact that the set current and voltage drop across the first formed conductive bridge is relatively large and the reset threshold for the first formed conducting bridge is generally less than the set threshold for either conductive bridge of an RFED. Therefore the operating window is very small. Further, the large current in the ON state allows rupture of the first-formed conductive bridge due to excessive Joules heating. While this is disadvantageous for the RFED program operation, it offers a beneficial capacity for generation of short current and voltage pulses.

Figure 14:
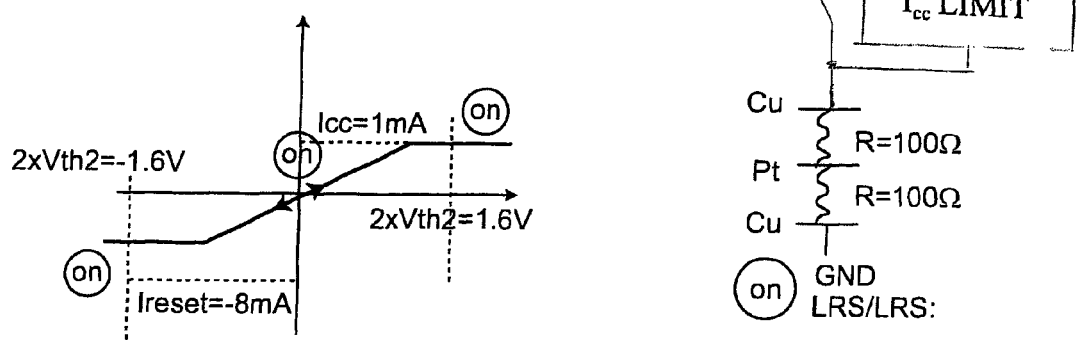
FIG. 14 illustrates application of a compliance current to an RFED.

Referring now to FIG. 14, application of a compliance current is illustrated. The I-V plot of FIG. 14 differs from the I-V plot of, for example, FIG. 12 by limitation of positive or negative ON state current to a level less than $I_{reset}$. Such a limitation of ON state current can be achieved very simply by, for example, a resistance in series with the RFED. This limitation of current at voltages near the set and reset thresholds adequately prevents the eroding or dissolution of conductive bridges that have been formed in the atomic switches of the RFED regardless of the polarity or, within limits, the magnitude of the bias voltage applied to the RFED which is thus maintained in the ON state. It should be noted that while the I-V plot of FIG. 14 illustrates a substantial magnitude of the compliance current for clarity and the compliance current can in fact, be a substantial fraction (e.g. one-half to one-tenth) of the reset current but is, in theory, more effective and reliable when set to a value smaller than the reset current by a factor of ten to one hundred, for example 0.1 milliamperes.

Figure 16:
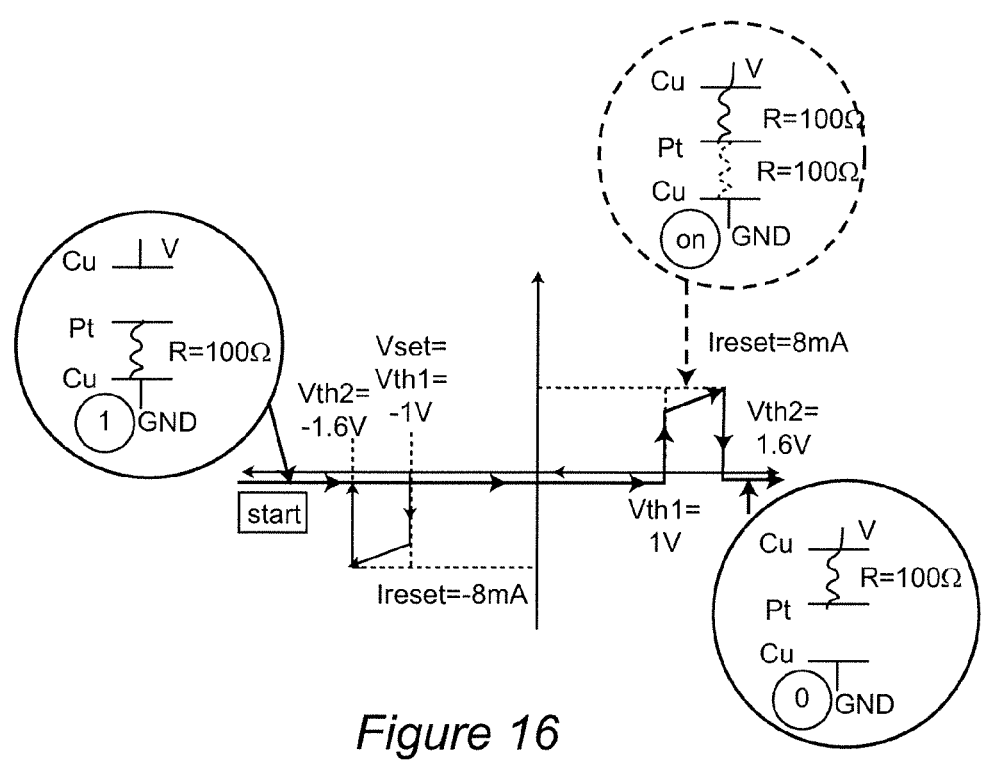
Figure 17:
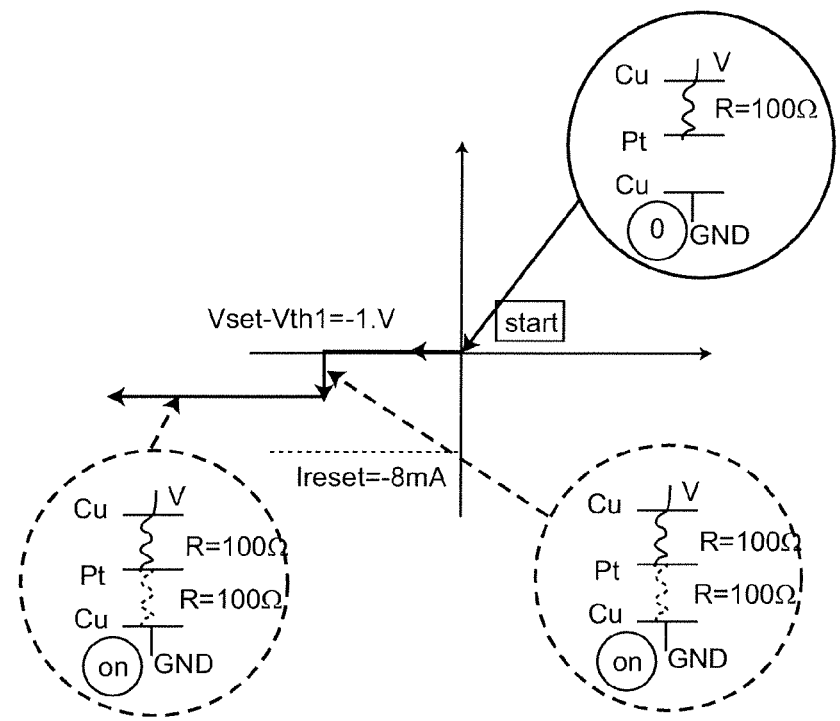
FIGS. 17 and 18 illustrate operation of an RFED using a compliance current.
Figure 18:
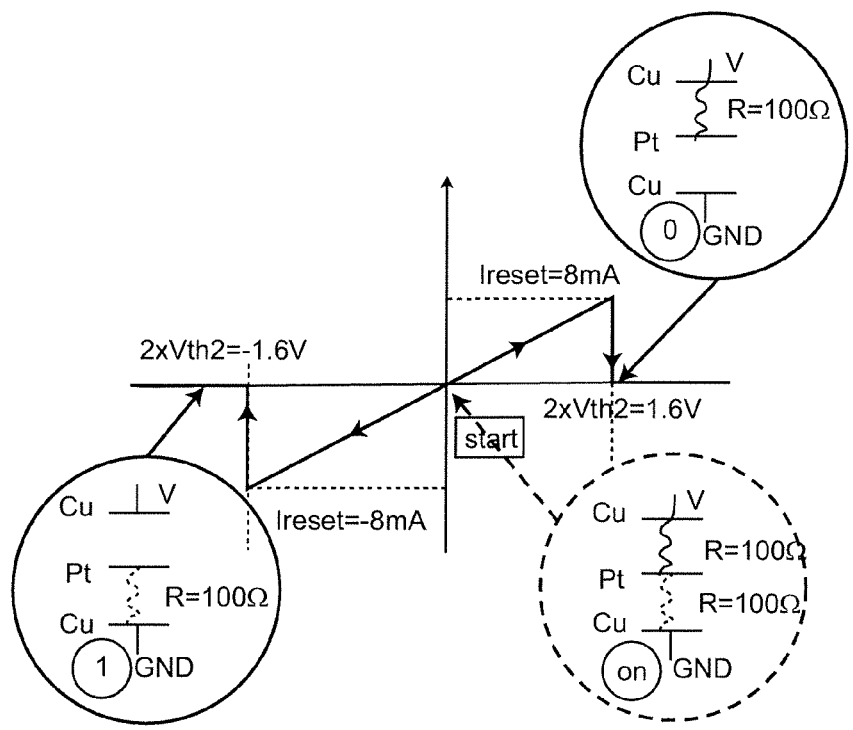

FIGS. 15 and 16 illustrate a cycle of operation of an RFED without application of the compliance current and, for comparison, a cycle of operation of the RFED with application of a compliance current will be illustrated in FIGS. 17 and 18. Referring now to FIG. 15 and assuming that the RFED is in a 0 (LRS/HRS) state with the upper conductive bridge in place, the bias voltage is swept from zero or a positive level to a negative level during which voltage excursion the current is substantially zero. At a sufficiently negative voltage $-V_{set}$ which is somewhat greater in magnitude $-V_{th1}$ at which a conductive bridge would be formed in an atomic switch (due to the voltage drop across the upper conductive bridge as the lower conductive bridge is formed), the RFED will assume the conductive ON state and as the bias voltage is swept to a more negative value, the current will increase ohmically. At a more negative voltage $-V_{th2}$, the upper conductive bridge is ruptured and the RFED returns to a non-conductive 1 (HRS/LFS) state and will remain non-conductive at even more negative bias voltages. FIG. 16 shows substantially the reverse process superimposed on the I-V plot of FIG. 15. As the voltage is swept toward positive voltages the RFED remains non-conductive until a bias voltage of $+V_{th1}$ is reached and the upper conductive bridge re-formed causing the RFED or RFED to assume the ON state in which current increases ohmically as bias voltage is further increased.

when a bias voltage of $+V_{th2}$ is reached, the lower conductive bridge is ruptured and a non-conductive 0 (LRS/HFS) state will be resumed.

Referring now to FIG. 17, operations on a RFED similar to those described above in connection with FIG. 15 are performed, starting with an assumed 0 (LRS/HRS) state but with compliance current limitation in the ON state. Specifically, as the bias voltage is swept from a zero or positive voltage toward a negative voltage, the RFED is non-conductive since the lower conductive bridge has not been formed. At $-V_{set}$, the lower conductive bridge is formed and the RFED assumes the conductive ON (LRS/LRS) state. However, since current is limited to the level of a compliance current, the ON state is maintained even at negative voltages beyond $-V_{th2}$. At bias voltage levels near zero volts, the current level may be allowed to vary ohmically between the positive and negative compliance current levels while the ON state is, nevertheless, maintained.

The limitation of current to the compliance current level is not critical but should be substantially below or a fraction of the reset current, $I_{reset}$, corresponding to the ohmic current level reached at $\pm V_{th2}$ in the operations described in regard to FIGS. 15 and 16. Without wishing to be held to any particular theory of operation of the compliance current to maintain the ON state under a broad range of voltage conditions, it appears that the limitation of current to a compliance current level during the ON state maintains the current level sufficiently low that erosion of ions and/or oxygen vacancies from the conductive bridges and drift-diffusion back to the active electrode does not occur regardless of the magnitude of the bias voltage that is applied. Thus, while an effective compliance current level can be a substantial fraction of $I_{reset}$, lower current levels should be even more effective and are highly desirable to limit ohmic heating and power consumption requirements. In fact, compliance current levels can be reduced to a small fraction of a milliampere. With current limited to a compliance current level, the ON state can be maintained indefinitely and can be exploited to enhance both read and write operations as will be discussed below. Since the compliance current level is not at all critical, compliance current limitation can be achieved very simply using any of a number of constant current source circuits or devices familiar to those skilled in the art, such as a MOSFET at saturation.

Referring now to FIG. 18, the RFED can now be written to either the 1 or 0 state by removing the limitation of current if the magnitude of the bias voltage is greater than $\pm V_{th2}$ removal of the compliance current limitation will cause the RFED to immediately assume the 1 or 0 state, respectively. If the bias voltage is near zero when a write operation is desired, the bias voltage is simply swept to $\pm V_{th1}$ to set the RFED to a 0 or 1 state, respectively.

Figure 19:
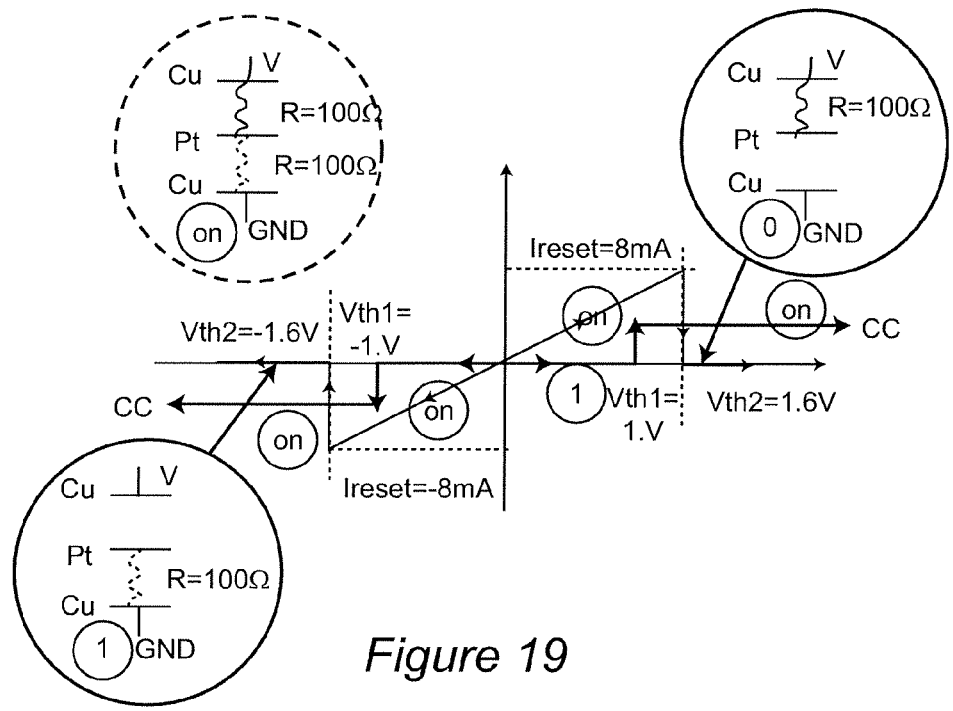
FIGS. 19 and 20 illustrate improvement of operation of an RFED by decoupling set and reset thresholds using a compliance current.
Figure 20:
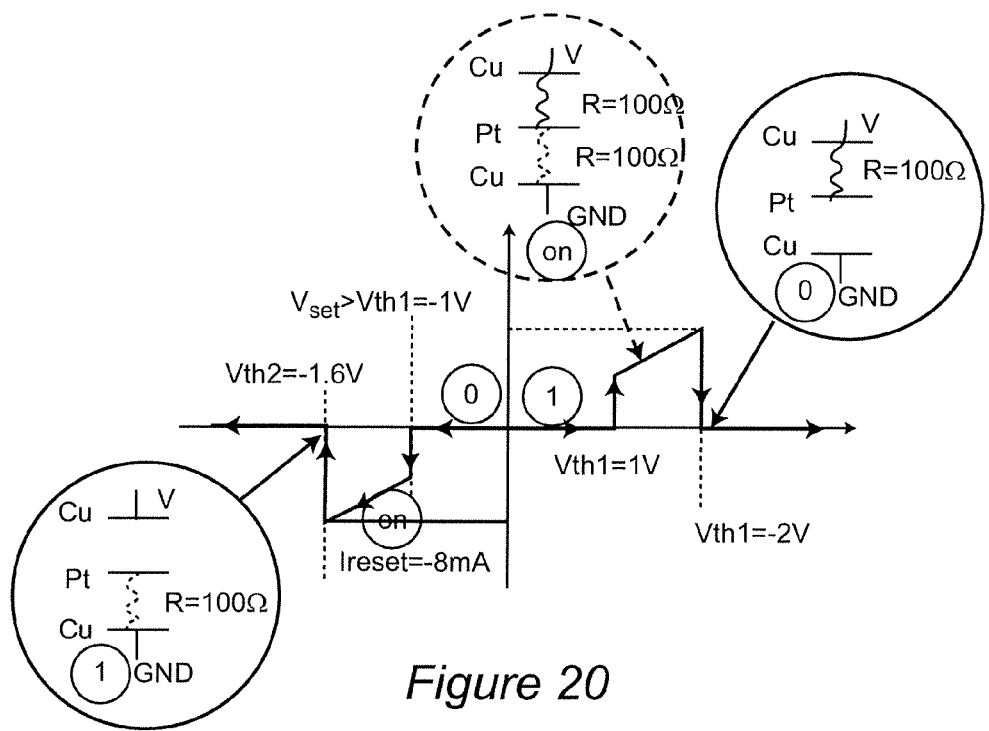

It should be noted that the use of a compliance current can allow the set and reset voltages to be decoupled as shown in FIG. 19. Assume that there are only two initial states: 0 (LRS/HRS) and 1 (HRS/LRS). Either of these states can be changed to the ON state (LRS/LRS) by applying $+V_{set}(>+V_{th1})$ with a compliance current smaller than the single atomic switch reset current. This ON state can then be changed to either a 1 or 0 state at any voltage having a magnitude greater than $\pm V_{th2}$ if the compliance current limit is removed. Thus a potentially very narrow operation window can be avoided and the RFED written to either state at any arbitrary voltage having a magnitude greater than $T_{th2}$. Further, the use of a compliance current limitation during the set operation can prevent soft breakdown of the device and improve overall device reliability. That is, as shown in FIG.

20, the operating window between the set and reset voltage magnitudes is diminished from the difference between $V_{th1}$ and $V_{th2}$ due to the voltage drop in the existing conductive bridge while the other conductive bridge is being formed. Thus, if $V_{th2}$ magnitude is not significantly different from or less than $V_{th1}$, the device cannot function properly as a memory device. Decoupling of the set and reset voltages allows writing at arbitrarily high voltage significantly different from the magnitude of $V_{th1}$, resulting in high reliability of the writing operation.

Figure 21:
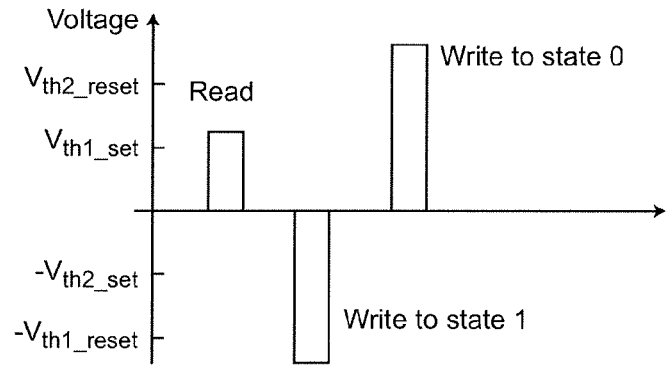
FIGS. 21 and 22 illustrate writing and reading operations of an RFED for discriminating different non-conductive states.
Figure 22:
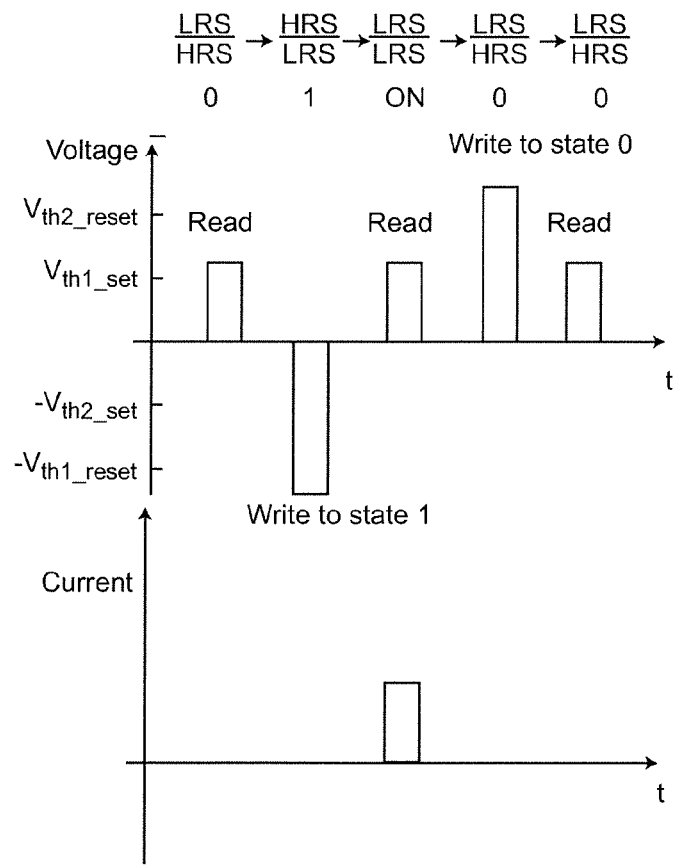

Referring now to FIG. 21, discrimination between the non-conductive 0 and 1 states during a read operation will now be discussed. As shown in FIG. 21, the ON state may be entered at $V_{set} > V_{th1}$ which can be supplied as a pulse, whether a limited compliance current is applied or not. From the ON state, either the 1 or 0 state can be reached by application of a positive or negative pulse of suitable magnitude with the compliance current limit removed. However, as shown in FIG. 22, a positive or negative pulse of magnitude $V_{th2} > V_{set} > V_{th1}$ applied to the RFED can serve as a read pulse to discriminate the 1 or 0 state of the RFED. For example, if the RFED is in the 0 state and a positive pulse of magnitude $V_{th2} > V_{set} > V_{th1}$ is applied, the ON state will not be entered since the polarity is opposite the polarity which will cause a lower conductive bridge to be formed. The RFED or RFED will remain in the non-conductive 0 (LRS/HRS) state and only a very small current, if any, will be detected. If, however, the RFED is in the 1 (HRS/LRS) state with the lower conductive bridge in place, a positive read pulse would cause the upper conductive bridge to be formed, the ON (LRS/LRS) state will be entered and a significant current can be detected to indicate a reading of the 1 state, in which case, the information is destroyed and the RFED must again be written to a 1 or 0 state. However, such an operation can be performed in a simple manner similar to refresh of a DRAM cell but only after a reading operation since storage is, for this structure, non-volatile. A similar discrimination can be performed using a negative $V_{th2} > V_{set} > V_{th1}$ pulse in which no current will be detected for a stored 1 state which will persist after the read operation but current will be detected upon entering the ON state from a 0 state.

It should be noted that if the RFED is in the intermediate, conductive ON state when a read pulse is applied the detected current will be limited by the compliance current level and the ON state can also be discriminated. The RFED is in the ON state only during a read operation when either a 0 or 1 state are being destroyed during the reading process, after which the RFED is programmed back into the 0 or 1 state. Thus for bit storage the RFED is never in the ON state nor in the OFF state.

In view of the foregoing, it is clearly seen that by choice of dielectric/electrolyte and electrode materials, the operating window of a RFED in accordance with the invention can provide a reliable storage or logic device that can be formed at a size much smaller than a single transistor at any given minimum feature size regime and which can be formed in an extremely compact cross-bar matrix array. If the dielectric/electrolyte layers are kept to a small thickness of under 100 (e.g. 16) nanometers, the writing and access times is on the order of a few nanoseconds. Further, by limiting current through the device when in a conductive ON state, the set and reset voltages can be decoupled, allowing an even broader choice of materials while increasing the reliability of the device and allowing non-conductive states to be discriminated in a simple manner.

Figure 23:
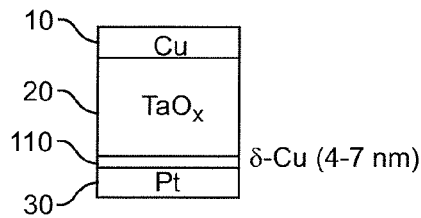
FIGS. 23, 24, 25 and 26 illustrate an atomic switch that exhibits controllable volatility and the operation thereof.

In accordance with a perfecting feature of the invention, in an RFED, an individual switch can be replaced by a modified switch such as that depicted in FIG. 23. That is, the modified switch of FIG. 23 could be used for either or both atomic switches in an RFED. The impact of such a substitution will now be discussed.

Referring now to FIG. 23, a perfecting feature of the invention which is not necessary to the practice of the invention in accordance with its basic principles but which can provide additional functionality and breadth of application of the invention will now be discussed. Specifically, it has been found by the inventors that if a additional thin (e.g. 4-7 nm) layer 110 of δ-copper (so-called because the layer is extremely thin even in comparison with other layer (e.g. the dielectric/electrolyte) is applied to the inert electrode of an atomic switch, both volatile and non-volatile switching behaviors can be selectively produced and the device can be controllably transitioned between volatile and non-volatile behaviors by control of the compliance current at which it is operated. If the device is operated at a compliance current below a critical value, the device will exhibit volatile behavior but if operated at a compliance current above the critical value, the device will exhibit non-volatile behavior. When a non-volatile copper nanofilament is reset as described above, the device will exhibit volatile behavior if and when it is thereafter operated at a compliance current below the critical value. These unexpected properties in an atomic switch permit numerous new applications in logic circuits, memristive circuits such as the memory array discussed in detail above, and chaotic circuits and neural networks as will be discussed below. Importantly, the atomic switch in accordance with this perfecting feature of the invention can perform as either an NVM, SRAM or a DRAM and SRAM and DRAM cells can be provided in the same device and may be collectively referred to as a resistance RAM (ReRAM or RRAM). Moreover, such a memory device can be dynamically configured to have different relative SRAM and DRAM capacities. Additionally, the controllable volatility switching device can be fabricated in a very small area such as 5 nm×5 nm and thus provides a substantial potential integration density advantage over other transistor-based storage cells such as the six-transistor SRAM cell alluded to above which are much too large for high integration density applications.

Figure 24:
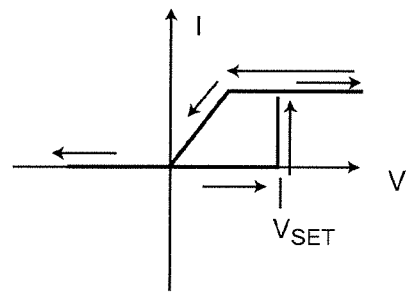
Figure 24:
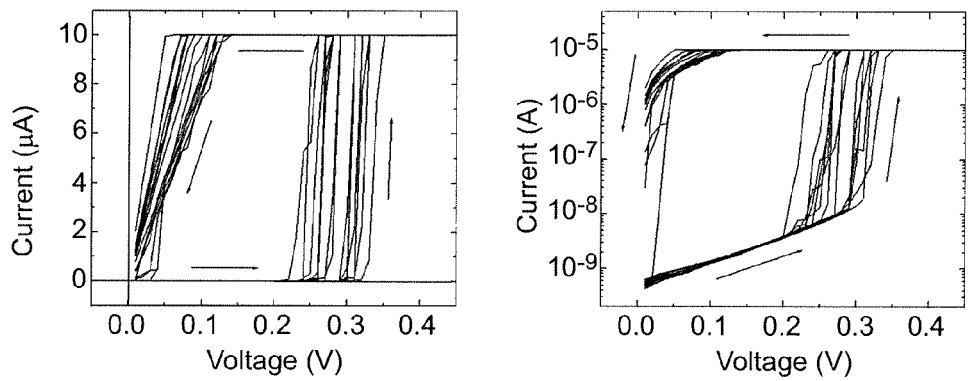

FIG. 23 also includes an I-V plot of the controllable volatility device operated in a volatile storage mode. As with the atomic switches described above, the conductive bridge is formed at $V_{set}$ with a compliance current limit applied. However, as the voltage is swept back to zero, the copper nanofilament dissolves and a high resistance state is assumed spontaneously. Therefore, no reset operation is required to change the storage state of the device. This process is highly repeatable as indicated by the I-V plots of FIG. 24 which show the same data but differ in scale. In other words, the atomic switch in the volatile switching mode behaves like a semiconductor diode. The practical impact is that with one additional mask during the processing of a single switch, predetermined cells in a cross-bar matrix can be rendered volatile while other cells exhibit non-volatile behavior. Thus, the cross-bar matrix array can provide both memory cells and diode-like devices.

Figure 25:
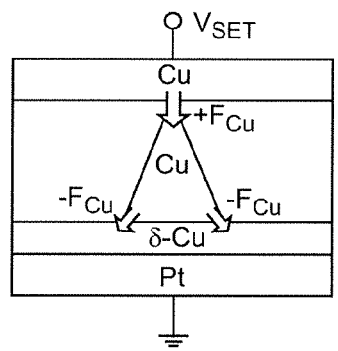

While not wishing to be held to any particular theory of how volatile switching is produced in such a cell, it is postulated that the spontaneous dissolution of copper filaments (CF) is an imbalance between the electric field-supported $Cu^+$ copper ion flux and the self-diffusion of copper in the CF and through the interface between the conductive bridge and the δ-Cu layer 110 on the platinum electrode, as conceptually shown in FIG. 25. In the absence of a δ-Cu layer 110, as in the atomic switches described above, there is no copper diffusion flux from the copper conductive bridge at the interface with the platinum inert electrode. The δ-Cu layer appears to enable such a diffusion flux from the copper conductive bridge into the δ-Cu layer 110 and the flux is supported by the enhanced local temperature resulting from Joule heating and tends to remove copper from the CF. If the rate of removal of copper from the CF is larger than the rate of field-supported copper ion flux, the CF dissolves spontaneously. The diffusion flux into the δ-Cu layer appears to increase with the thickness of the δ-Cu layer and the above hypothesis appears to be verified by forming a Cu/TaO$_x$/Cu device in which CF formation could not be observed.

By the same token the thickness of the δ-Cu layer appears to be relatively critical to the production of controllable volatility. If the δ-Cu layer is less than about 4 nm, only non-volatile switching behavior can be achieved. In such a case, the δ-Cu layer is too thin to support substantial diffusion and depletion of copper from the CF. The behavior of such a device is substantially the same as a device in which the δ-Cu layer is omitted. If the thickness of the δCu layer is in the range of 4-8 nm, controllably volatile switching behavior is obtained. Above 8 nm δ-Cu layer thickness, no CF formation is observed as the limiting case of Cu/TaO$_x$/Cu geometry is quickly approached.

The Cu flux in the δ-Cu layer is mainly controlled by the thickness of that layer, but is also a function of the current passing through the CF by virtue of increased temperature due to the Ohmic or Joule heating due to the current which increases diffusivity. Thus, by control of thickness of the δ-Cu layer and control of compliance current the time over which spontaneous reset occurs can be controlled to some degree.

Figure 26:
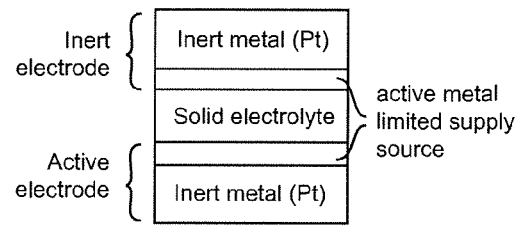

The copper ion flux is mainly controlled by the applied voltage but also, to a degree, by the supply of Cu atoms which is maximized by the bulk copper electrode. However, it is possible to control the flux of copper ions by replacing the bulk copper electrode with an inert electrode having a second layer of δ-Cu in contact with the dielectric/electrolyte as shown in FIG. 26.

Figure 27:
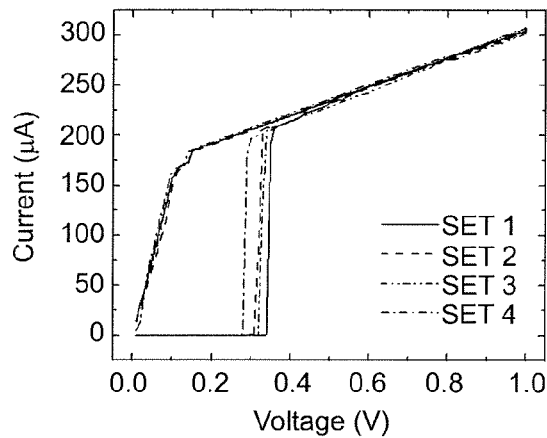
FIGS. 27, 28, 29 and 30 illustrate electrical characteristics of a controllable volatility atomic switch.

Referring now to FIG. 27, another potentially useful property of the controllable volatility device will be discussed. Specifically, the device can be operated in two different I-V regimes having different resistance characteristics. With the positive voltage sweep beginning a 0V, as shown in FIG. 27, when the bias voltage reached $V_{set}$ the CF will be formed and will have a resistance of about 1000Ω. As soon as the bridge is formed substantial current in excess of 200 mA will flow through the bridge if not limited to a compliance current level; leading to Joule heating and increased diffusivity in the δ-Cu layer copper removal from the bridge and resistance increase. At any given voltage, the power is given by $P=V^2/R$, and the bridge will tend to stabilize to balance the copper and copper ion fluxes, indicated by the slope of $R_{on1}$. During the voltage sweep back to zero, the bridge is substantially stable but of sharply increased resistance as the bridge dissolves, indicated by the slope $R_{on2}$.

Figure 28:
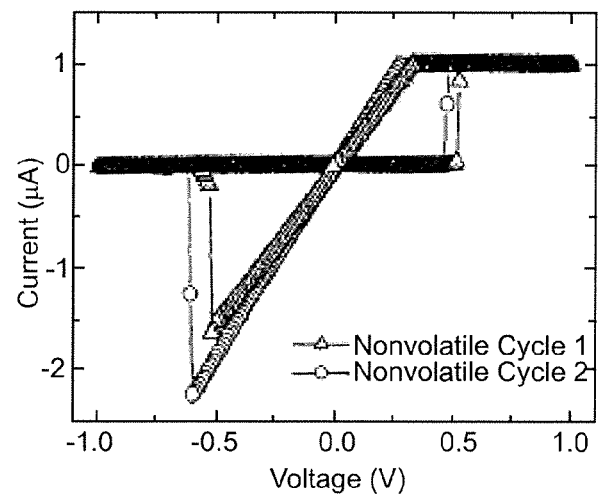

Referring now to FIG. 28 the transition between volatile and non-volatile witching behavior will now be discussed. When the controllable volatility device is operated at currents above about 1 mA a transition from volatile to non-volatile behavior is observed. Two set/reset cycles of operation of the controllable volatility device are shown in FIG. 28 in which the current is limited to a compliance current level of slightly more than 1 mA. It is seen that a voltage excursion to about −0.5 V to −0.6 V and a current of about −2.0 mA is required to achieve reset. However, once reset, the device can again be made to exhibit volatile behavior if the currents are limited to a compliance current of below several hundred μA.

Figure 29:
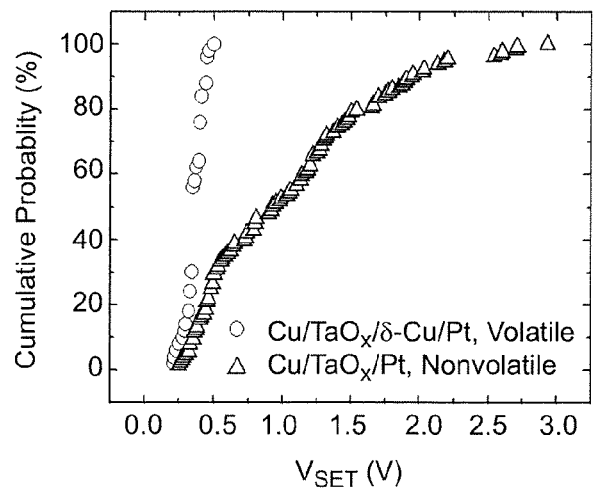
Figure 30:
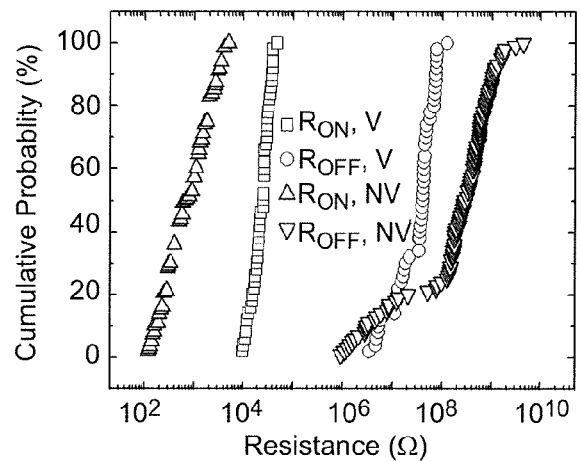

Some additionally improved properties of the asymmetrical controllable volatility device. Specifically, as shown in FIG. 29, the cumulative statistical distribution of set voltage at which proper CF formation occurs over a range of $V_{set}$ voltages is graphically illustrated for the controllable volatility device of FIG. 23 and an atomic switch illustrated in FIG. 1. It is seen that the range of $V_{set}$ voltages at which setting may occur is much smaller for the controllable volatility device than for the atomic switch of FIG. 1.

Figure 31:
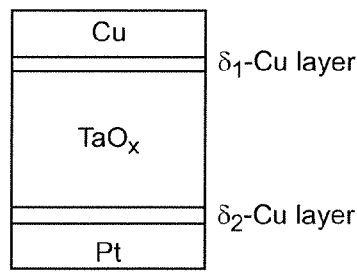
FIG. 31 schematically illustrates a variant form of a controllable volatility atomic switch.

Similarly, the $R_{on}$ and $R_{off}$ resistance distributions are much tighter for the controllable volatility device that for the atomic switch FIG. 1 without the δ-Cu layer. Tight distributions are necessary for commercial circuit applications. As alluded to above, by using δ-Cu layer thicknesses on both the copper an inert electrodes to control the respective copper and copper ion fluxes, the switching properties of the controllable volatility switching device can be optimized for a wide range of applications. A variant structure of substantially universal applicability where controllable volatility or particularly tight switching characteristics are advantageous is schematically shown in FIG. 31.

Further fine-tuning of $V_{set}$ can be achieved by the choice of electrode materials since the energy required for converting migrating ions to neutral atoms (e.g. copper and/or oxygen) are observed to be different for some different metals. For example, the overvoltage potential of an electrochemical reaction to convert $O^{-2}$ to $O_2$ for platinum is 0.77 V; 0.56 V for nickel, 1.02 V for gold and 0.93 V for palladium. Thus the switching device in accordance with this perfecting feature of the invention provides much improved performance compared to other atomic switch designs but can be optimized to closely match requirements for a wide range of applications.

The ability to adjust the electrical responses of RFEDs or controllable volatility devices is also useful in developing various logic functions. While a RFED or controllable volatility switching device is, in essence a transmission gate, simple logic functions can be achieved by responses to sequential inputs, arrays of cells that can be pre-set to achieve logical combinations of concurrent inputs, responses to different voltage levels or time durations and the like. The variety of the parameters of electrical signals to which RFEDs and/or controllable volatility device can respond also provides qualities that are particularly useful for neural networks as will now be discussed as illustrative of the variety of ways in which the invention can be employed to perform logic functions. In this application, single switches are joined serially such that the floating electrode can be configured as a bi-layered composite of an inert and an active electrode.

It is important to keep in mind that a major characteristic of the memristive switch (r-switch) is that the state variable is not a voltage but the total quantity of charge injected into the solid dielectric/electrolyte sandwiched between an active electrode and an inert electrode. Therefore the output/response characteristic of an r-switch depends on the prehistory of its operation. For example, a slight variation of the I-V characteristic is observable over two successive set-reset cycles of the controllable volatility switch in FIGS. 27 and 28. More generally, at a given applied voltage, $V_{ap}$, across the switch, a finite time, $\tau_{crit}$, is required to establish a CF which varies as a function of both voltage and dielectric/electrolyte thickness (generally 8-32 nm). When a CF is established in a given cell, the cell switches abruptly from a high resistive state, $R_{off}$, (for example, between 1 MΩ (e.g. for oxygen deficient $TaO_x$) to 300 GΩ (e.g. for $Ta_7O_5$)) to a low resistive state (typically 80Ω to 400Ω). This yields an on/off resistance ratio of about $10^6$ to $10^9$, far higher than can be obtained from transistors particularly when fabricated at small sizes.

For a sufficiently large $V_{ap} > 3V_0$, there is an exponential relationship between $V_{ap}$ and $\tau_{crit}$:

$$\tau_{crit} = \tau_0 \exp(-V_{ap}/V_0) \tag{1}$$

where $\tau_0$ and $V_0$ are constants that depend upon cell geometry and materials, respectively. For 32 nm thick tantalum oxide based dielectric/electrolytes described above and copper as the active electrode, $\tau_0 = 120$ seconds and $V_0 = 300$ mV have been extracted from experimental data. For example, at $V_{ap} = 1.0$ V, $\tau_{crit} = 1.24$ seconds. Thus, when several switches are connected in series to form a voltage divider and the on and off resistances selected appropriately, it is possible to determine, for a given applied voltage across the series-connected switches, the time that each switch will transition from the off state to the on state and the transitions will occur in a cascaded manner at predetermined times and produce predetermined current levels. The reverse process, referred to as unlearning, can also be made to progress in a cascaded manner through choice of materials and cell geometry to produce different reset current for the cells. The cell with the lowest reset current will rupture first; increasing the resistance in the serial string and reducing current until current or reset voltage is increased. Such electrical behavior is particularly useful for neural, adaptive and artificial intelligence circuits where a response is learned from prior stimuli.

Figure 32:
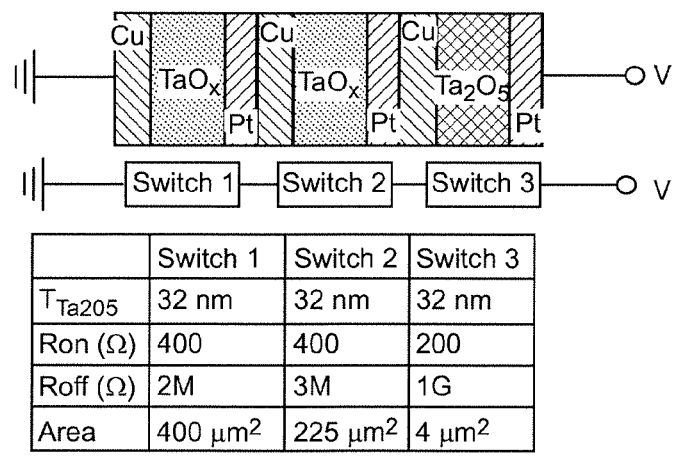

Referring now to FIG. 32, an exemplary series connection of three atomic switches is schematically shown together with the chosen electrolyte and geometry of each cell. In this application, single switches are joined serially (e.g. the floating electrode is now a bi-layered composite of an inert and an active electrode). It should be appreciated that a serial connection of any number of atomic switches can be fabricated using the method described above in connection with FIG. 8 but adding additional active electrode layers on each inert electrode layer (to provide serial rather than anti-serial connections) and additional patterning of the interior electrode layers. Moreover, the serial connection of r-switches can be fabricated at a single site of a cross-bar matrix although the area required will be the area of the matrix site must accommodate the largest area switch in the series connection. However, with proper choice of materials all three switches could be of minimum feature size. The area of the respective switches is principally important to the respective $R_{off}$ values which decrease with increased switch area. As switches sequentially become conductive the reduction of resistance will determine the increase in current flow in the series connection for the voltage applied (which must initially be large; approaching the sum of the set voltages of the cells of the series connection) and the area is thus important to the time period prior to the setting of the next switch in the sequence. Different areas are employed in the series connection of r-switches shown in FIG. 32 to allow use of tantalum oxide-based dielectric/electrolyte in all of the r-switches.

The electrical response of the series connection of r-switches of FIG. 32 is shown for two different applied voltages of 1.2 V and 2.0 V in FIGS. 33A and 33B, respectively. It can be seen that the cascaded response is quite similar but that the cascaded sequence of switching occurs far more rapidly at the higher voltage in accordance with the exponential response indicated by Equation (1), above. In this regard, it should be noted that the cascaded switching accelerates as switching of the individual switches occurs; thus increasing the voltage applied to the switches remaining in the off state. The current levels produced are shown analytically in FIG. 33C. It should be noted that the changes in current level, while not instantaneous, are very rapid and are quite stable at any level; allowing the state of the circuit to be unambiguously read although the point (II) at which r-switch 2 become conductive is small due to the particular choice of dielectric/electrolyte and occurs almost simultaneously with r-switch 3 becoming conductive at higher voltage.

Figure 34:
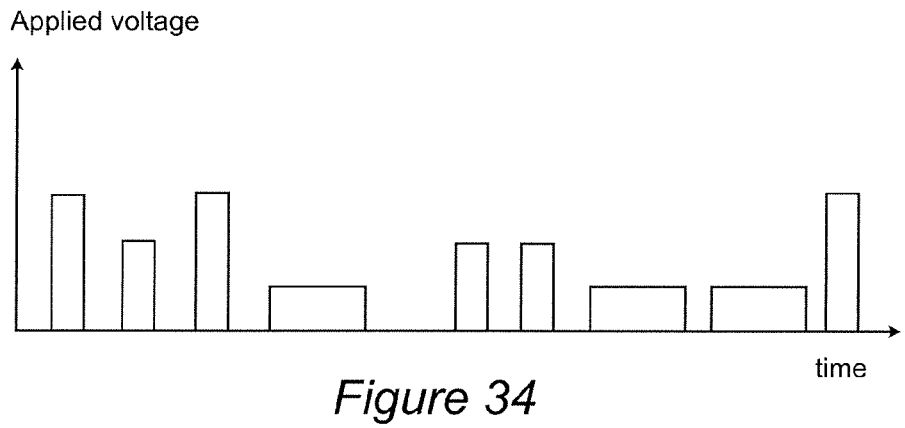
FIG. 34 illustrates exemplary waveforms for selectively programming the circuit of FIG. 32, and FIGS. 35A and 35B illustrate a logic circuit similar to FIG. 32 providing accelerated learning and forced and selective unlearning.

Recalling that the state variable is the amount of charge injected into the solid electrolyte and the amount of charge is largely a function of $V_0$, this behavior suggests that accurate control of the state of switches can be achieved using pulses and that the order of r-switches become conductive could be controlled by pulses of different heights and widths as shown in FIG. 34.

Figure 35A:
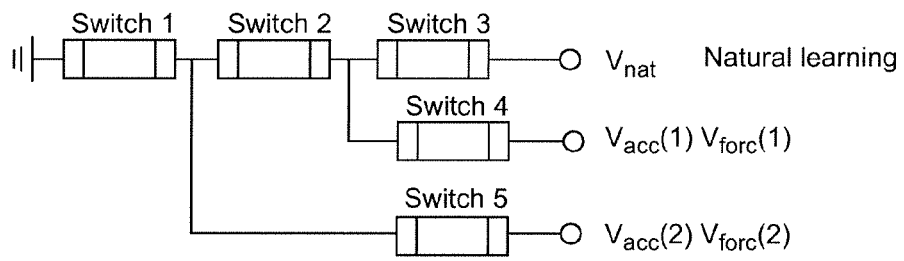
Figure 35B:
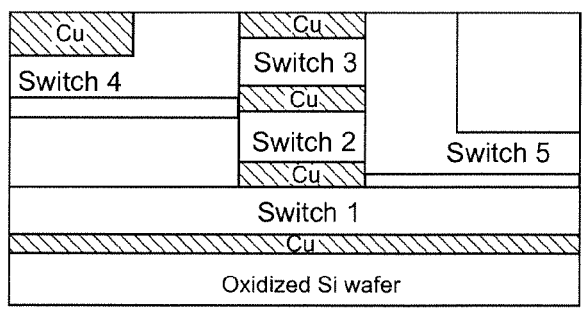

Learning and unlearning operations can be made specific to each respective r-switch and can also be accelerated by the addition of two anti-serial branch connections to the serial connection of FIG. 32. Such a circuit is schematically shown in FIG. 35A and fabrication in cross-bar matrix form is shown in cross-section is FIG. 35B. It should be noted that this circuit requires only three adjacent cross-bar matrix sites and can also be formed at minimum feature size by a process similar to that described above in connection with FIG. 8 but differing in the patterning of interior inert electrode layers to form RFEDs.

In view of the foregoing, it is seen that the invention provided an alternative to transistor-based storage and logic cells that can be formed at much smaller areas and integrated much more densely. Controlled volatility allows both static and dynamic memory cells to be provided in identical structures in the same device on the same array. Arbitrary logic functions can be derived in a variety of ways and neural, adaptive and artificial intelligence circuits capable of learning or unlearning can be easily provided.

While the invention has been described in terms of a single preferred embodiment and perfecting features, those skilled in the art will recognize that the invention can be practiced with modification within the spirit and scope of the appended claims.

The invention claimed is:

1. A method of operating an atomic switch comprising steps of
   applying a threshold voltage across said atomic switch to form a conductive filament that renders said atomic switch conductive,
   limiting current through said atomic switch to a level less than a current level required to rupture said filament and render said atomic switch substantially non-conductive and of relatively higher resistance than in said conductive state to maintain said atomic switch in said conductive state, and
   terminating said step of limiting current while said voltage applied to said atomic switch is equal to or greater than a threshold voltage required to render said atomic switch substantially non-conductive and of said relatively high resistance due to rupturing of said filament.

2. The method as recited in claim 1, wherein said atomic switch is one of two atomic switches connected in anti-serial relationship.

3. The method as recited in claim 2, including a further step of
applying a reset voltage having a magnitude greater than a reset threshold to said two atomic switches while performing said step of limiting current whereby an ON state of said two of atomic switches is maintained.

4. The method as recited in claim 3, including a further step of
terminating said step of limiting current while a voltage having a magnitude greater than said reset threshold is applied, whereby a reset voltage of one atomic switch is decoupled from a set voltage of the other atomic switch.

5. The method as recited in claim 1, wherein said atomic switch is one of two or more atomic switches connected in serial relationship.

6. The method as recited in claim 5, including a further step of
applying a reset voltage having a magnitude greater than a reset threshold while said atomic switch is in an ON state and performing said step of limiting current whereby an ON state of said atomic switch is maintained.

7. The method as recited in claim 6, including a further step of
terminating said step of limiting current while a voltage having a magnitude greater than said reset threshold of said atomic switch is applied, whereby said reset voltage of said atomic switch is decoupled from a set voltage of another atomic switch.

8. An atomic switch comprising
an inert electrode,
an active or further inert electrode spaced from said inert electrode,
a solid dielectric/electrolyte filling a space between said inert electrode and said active or further inert electrode, and
means for limiting current through said atomic switch when said atomic switch is in a conductive state to a level less than a current level that renders said atomic switch non-conductive and terminating said limiting of current.

9. The atomic switch as recited in claim 8, further including
a δ-copper layer on said inert electrode.

10. The atomic switch as recited in claim 9, wherein said δ-copper layer has a thickness of less than 4 nm.

11. The atomic switch as recited in claim 9, wherein said δ-copper layer has a thickness of between 4 nm and 8 nm.

12. The atomic switch as recited in claim 9, wherein a compliance current level for limitation of current by said means for limiting current is chosen such that the atomic switch is selectively operated in a volatile or non-volatile mode.

13. The atomic switch as recited is claim 8, connected in anti-serial relationship with another atomic switch to form a resistive floating electrode device having a common inert electrode.

14. The atomic switch as recited in claim 8, wherein said atomic switch is formed within a cross-bar matrix of atomic switches.

15. The atomic switch as recited in claim 10, wherein said atomic switch is formed within a cross-bar matrix of atomic switches.

16. A logic device comprising
three or more serially connected atomic switches wherein said serially connected atomic switches are stacked with an inert electrode of one atomic switch being directly adjacent to an active metal electrode of another atomic switch, said three or more atomic switches exhibiting OFF state resistances that differ from each other, ON state resistances that differ from each other and reset currents that differ from each other, and
an additional atomic switch connected to a node between two of said three or more serially connected atomic switches.

17. The logic device as recited in claim 16, wherein voltages are applied to said additional atomic switch as pulses of different selected amplitude and/or duration.

18. The logic device as recited in claim 16, wherein voltages are applied to said serially connected atomic switches as pulses of different selected amplitude and/or duration.

19. A method of operating an anti-serial connection of two atomic switches, said method comprising steps of
applying a threshold voltages across said atomic switches to render said atomic switches conductive,
limiting current through said atomic switches to a level less than a current required to render either of said atomic switches non-conductive regardless, within limits, of voltage applied across said anti-serial connection of said two atomic switches, and
terminating said step of limiting current while an applied voltage applied to either of said atomic switches is of a magnitude greater than a threshold voltage required to render a respective one of said two atomic switches non-conductive.

* * * * *